US007456491B2

(12) United States Patent
Pilla

(10) Patent No.: US 7,456,491 B2
(45) Date of Patent: Nov. 25, 2008

(54) LARGE AREA ELECTRON EMISSION SYSTEM FOR APPLICATION IN MASK-BASED LITHOGRAPHY, MASKLESS LITHOGRAPHY II AND MICROSCOPY

(76) Inventor: Subrahmanyam V. S. Pilla, 10452 Caminito Alvarez, San Diego, CA (US) 92126

( * ) Notice: Subject to any disclaimer, the term of this patent is extended or adjusted under 35 U.S.C. 154(b) by 269 days.

(21) Appl. No.: 11/188,043

(22) Filed: Jul. 22, 2005

(65) Prior Publication Data

US 2006/0017049 A1 Jan. 26, 2006

Related U.S. Application Data

(60) Provisional application No. 60/590,543, filed on Jul. 23, 2004.

(51) Int. Cl.
*H01L 33/00* (2006.01)
(52) U.S. Cl. .............. 257/653; 257/728; 257/E33.004; 257/E33.005; 257/E33.006; 438/20; 250/427
(58) Field of Classification Search ............... 257/728, 257/784, 653, E33.004, E33.005, E33.006; 438/20; 250/427
See application file for complete search history.

(56) References Cited

U.S. PATENT DOCUMENTS

| 3,665,241 | A | | 5/1972 | Spindt et al. ............... 313/351 |
|---|---|---|---|---|
| 4,994,708 | A | * | 2/1991 | Shimizu et al. ............. 313/306 |
| 5,007,058 | A | * | 4/1991 | Hayes et al. .................. 372/4 |
| 6,175,122 | B1 | | 1/2001 | Groves et al. .......... 250/492.23 |
| 6,187,604 | B1 | | 2/2001 | Gilton ........................ 438/20 |
| 6,194,732 | B1 | | 2/2001 | Okino .................... 250/491.1 |
| 6,333,508 | B1 | | 12/2001 | Katsap et al. ............. 250/492.2 |
| 6,426,234 | B2 | | 7/2002 | Gilton ........................ 438/20 |
| 6,529,304 | B1 | * | 3/2003 | Kimura et al. .............. 398/157 |
| 6,614,035 | B2 | | 9/2003 | Hartley .................. 250/492.23 |
| 6,815,875 | B2 | | 11/2004 | Kuo et al. .................... 313/309 |
| 6,844,664 | B2 | | 1/2005 | Komoda et al. ............. 313/310 |
| 7,075,223 | B2 | * | 7/2006 | Ando ........................ 313/495 |
| 7,176,609 | B2 | * | 2/2007 | Takeuchi et al. ............ 313/311 |
| 7,176,615 | B2 | * | 2/2007 | Song et al. .................. 313/497 |

OTHER PUBLICATIONS

B.J. Kampherbeek, et al., *An Experimental Setup to Test the MAPPER Electron Lithography Concept*, Microelectronic Engineering 53 (2000), pp. 279-282.
C. David, et al., *Low Energy Electron Proximity Printing Using a Self-Assembled Monolayer Resist*, Microelectronic Engineering 30 (1996), pp. 57-60.
S. Pilla, et al., *A Porous Silicon Diode as a Source of Low-Energy Free Electrons at milli-Kelvin Temperatures*, Journal of Applied Physics 98, 2005, pp. 1-7.

* cited by examiner

*Primary Examiner*—Evan Pert
*Assistant Examiner*—Victor A. Mandala, Jr.
(74) *Attorney, Agent, or Firm*—Whyte Hirschboeck Dudek SC

(57) ABSTRACT

The present invention relates to a various systems for generating and directing electron flow, and related methods, manufacturing techniques and related componentry, such as can be used in lithography, microscopy and other applications. In one embodiment, the present invention involves a system that includes an electron source having a plurality of independently-actuatable emission surfaces each of which is capable of emitting electrons, and an optical column adjacent to the electron source through which the emitted electrons pass. The optical column includes a plurality of actuatable electrodes that are capable of influencing paths taken by the emitted electrons.

62 Claims, 13 Drawing Sheets

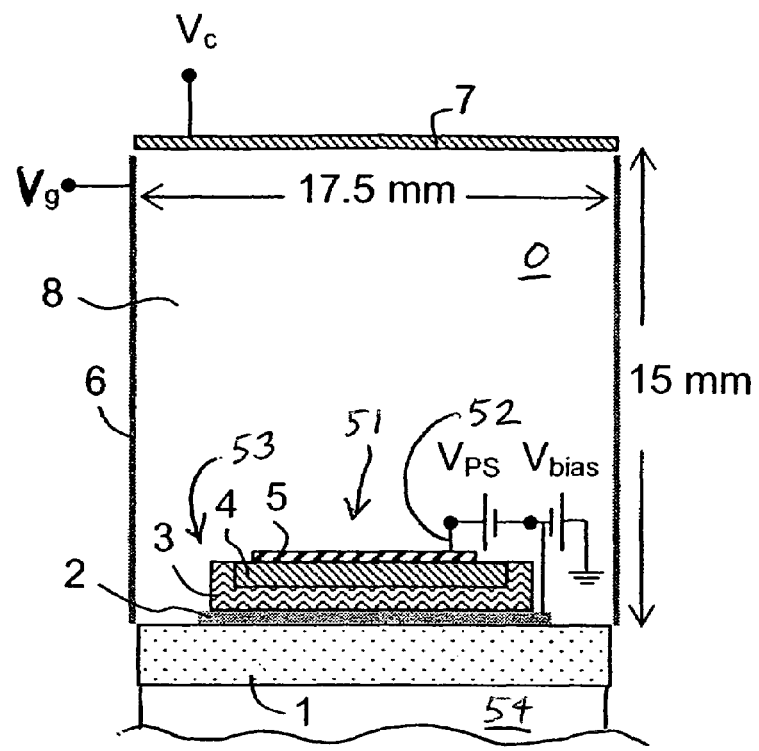
FIG. 1
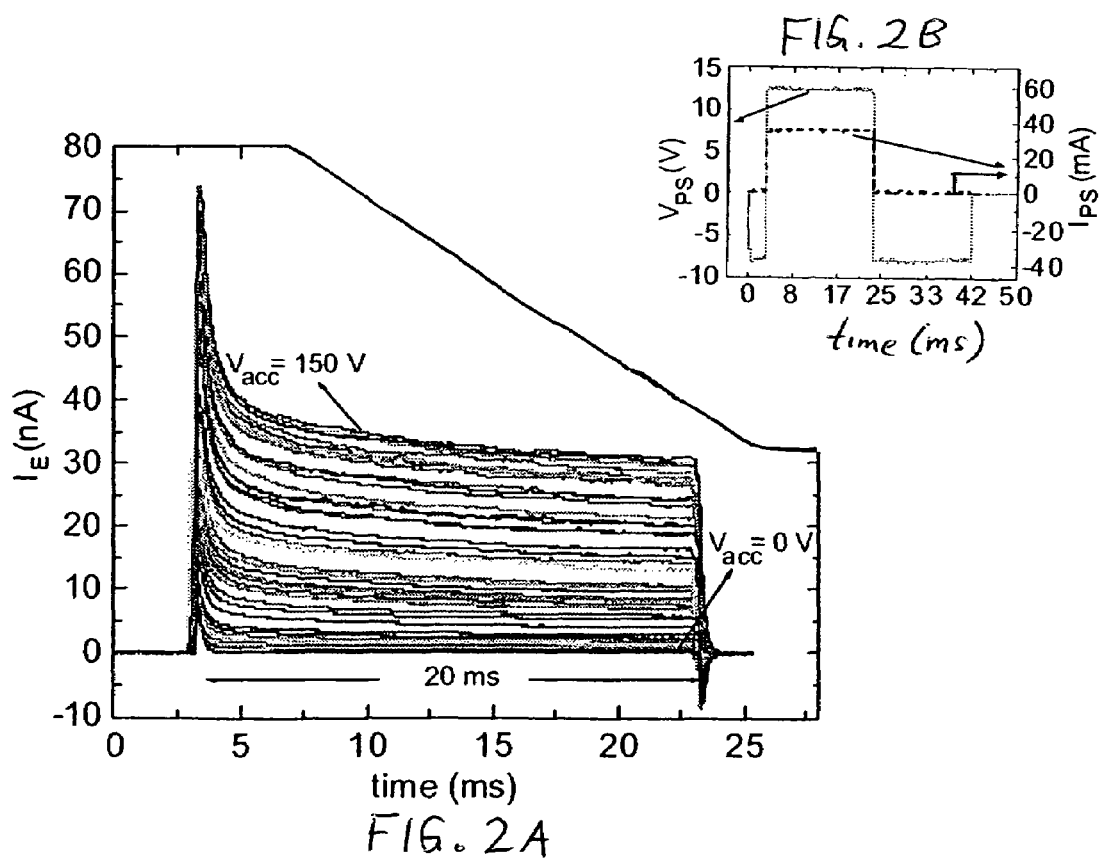
FIG. 2B
FIG. 2A

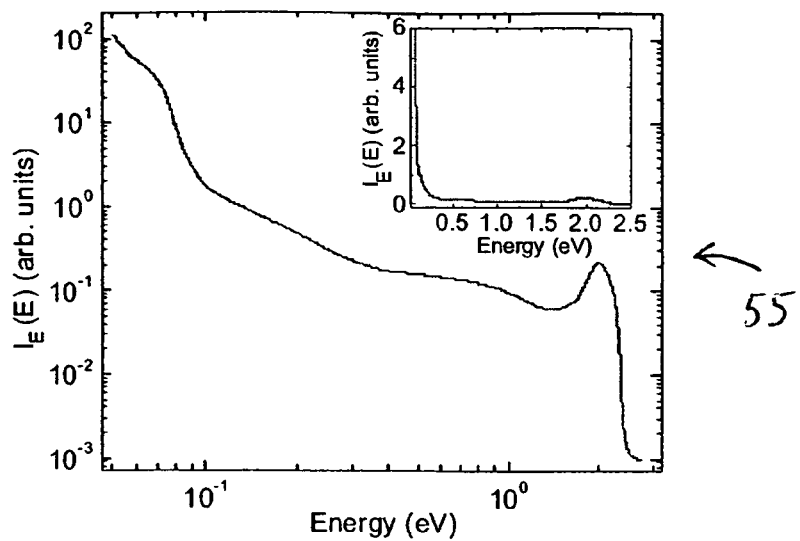
FIG. 3
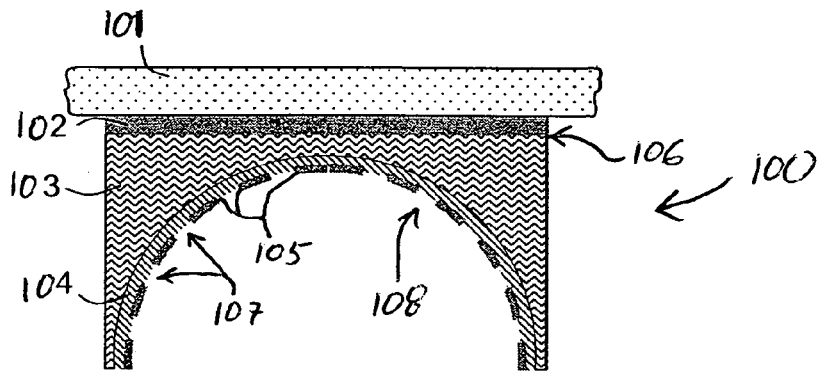
FIG. 4
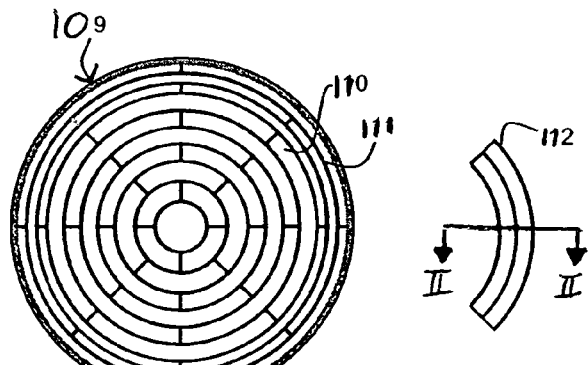
FIG. 5A
FIG. 5B

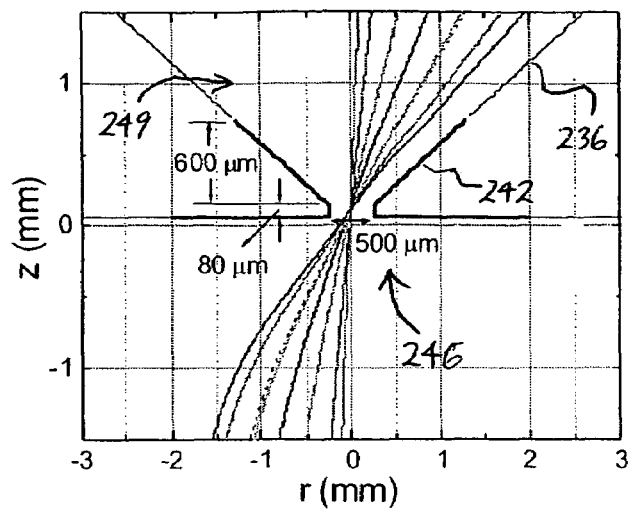
FIG. 11
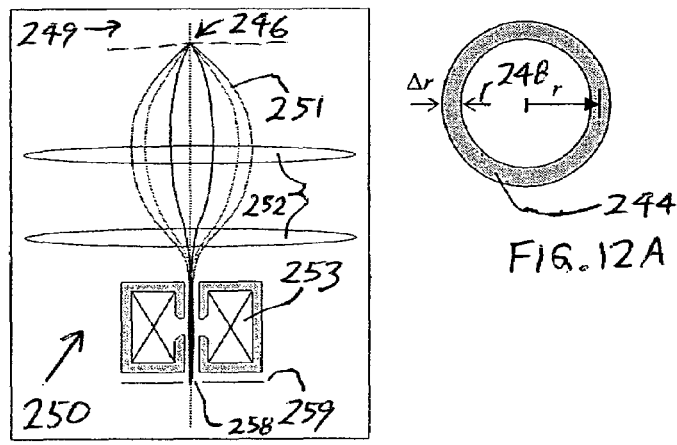
FIG. 12A
FIG. 12B
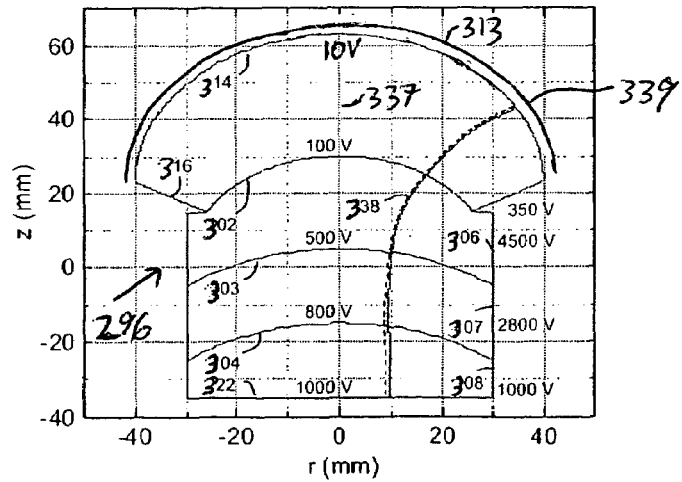
FIG. 13A

LARGE AREA ELECTRON EMISSION SYSTEM FOR APPLICATION IN MASK-BASED LITHOGRAPHY, MASKLESS LITHOGRAPHY II AND MICROSCOPY

CROSS-REFERENCE TO RELATED APPLICATIONS

This application claims the benefit of U.S. provisional patent application No. 60/590,543 entitled "Non-Proximity Projection Lithography and Mask-less Lithography II with Electrons" filed on Jul. 23, 2004, which is hereby incorporated by reference herein.

STATEMENT REGARDING FEDERALLY SPONSORED RESEARCH OR DEVELOPMENT

This invention was made with United States Government support awarded by the following agency: National Science Foundation (NSF) Grant No. 0085922. The United States Government has certain rights in this invention.

FIELD OF THE INVENTION

The present invention relates to electron optics, and more particularly in at least some embodiments relates ultra large field electronic optics based on large area electron emission sources and a variety of applications in areas such as mask-based lithography, Maskless Lithography II and microscopy.

BACKGROUND OF THE INVENTION

The success of the modern semiconductor industry largely relies upon lithography, the art of transferring a given circuit pattern to a semiconductor substrate. Several techniques are available for lithography depending upon the type of radiation used for the pattern transfer, for example, optical, x-ray, UV, focused ion, and electron beam radiation. The wavelength of the radiation that is employed, as well as the optics involved, dictate the smallest feature size (e.g., the "Critical Dimension" or "CD") in the circuit that can be transferred during the lithographic process.

Electron beams (ebeams), unlike all other radiation types, can be easily accelerated to energy levels of greater than 20 kV. As a result, it is possible to achieve ebeams with wavelengths of less than 10 pm. For this reason, lithographic processes employing ebeams are quite desirable in theory. However, conventional lithographic processes employing focused electron beam radiation are limited insofar as the electron beams can only be generated by way of narrow point sources, for example, by way of a hot filament or Spindt type field emission tip such as that disclosed in U.S. Pat. No. 3,665,241, which is hereby disclosed by reference herein.

Due to the narrow width of ebeams used in conventional lithography techniques, it is often possible to achieve CDs of approximately 1 nm. Yet due to the narrow width of the ebeams, conventional lithography processes also require special procedures to allow relatively large chips to be generated using the narrow ebeams. For example, in some conventional embodiments, the lithography process involves an ebeam writer that moves the narrow ebeam in relation to a mask/wafer in a rasterizing manner. However, such a serial tool, also known as direct-write tool, is unsuitable for high volume, commercial semiconductor manufacturing.

To address these problems, several techniques that utilize multitudes of narrow ebeams in parallel configurations have also been developed. Among these techniques, for example, are those disclosed in U.S. Pat. Nos. 6,333,508; 6,614,035; 6,175,122; and 6,194,732 as well as in B. J. Kampherbeek et al., "An experimental setup to test the MAPPER electron lithography concept," Microelectronic Engineering 53: 279-282 (2000), and C. David et al., "Low energy electron proximity printing using a self-assembled monolayer resist," Microelectronic Engineering 30: 57-60 (1996), each of which is hereby incorporated by reference herein.

The electron optics developed for all these techniques based on conventional point sources limits the maximum usable beam diameter (and optical field) to <1 mm as opposed to several cm of optical field in UV, x-ray and visible radiation. Therefore, to expose an entire wafer with several dies, one requires precise mechanical movement of the wafer stage, accurate registration, and stitching of multiple optical fields. These complex processes increase the cost of the lithographic tools. In addition, stochastic electron-electron interactions limit the maximum fluence achievable in a small optical field (<1 mm) for a given CD, thereby limiting the wafer throughput.

Because of the limitations associated with using point sources to generate electron beams, various efforts have been made to develop other types of sources for electron beams. Recently, various devices allowing field emission from planar structures such as MIM (Metal Insulator Metal) devices and MOS (Metal Oxide Semiconductor) devices have been developed. One subclass of devices within the broader class of MOS devices are Metal-Porous Silicon-crystalline Silicon structures known as PS diodes, such as are disclosed in U.S. Pat. Nos. 6,844,664; 6,815,875; 6,187,604; and 6,426,234, which are hereby incorporated by reference herein. Several variations of this type of electron source are available in the public literature as well.

Although the aforementioned planar structures offer the capability of outputting wider beams of electrons, each of these conventional devices suffers from several problems. In particular, these problems include poor reproducibility of emission characteristics over a large area of the device as well as from device to device, a short working life, and a large spread in the energy spectrum of the emitted electrons. These technical problems prevent the devices from being useful in lithography as well as other high end applications such as microscopy.

Therefore, it would be advantageous if a new or improved system for generating focused electron beams could be developed that allowed for the generation of electron beams having greater beam width. Further, it would be advantageous if such a new or improved system employed a source that did not suffer from the same disadvantages as conventional planar PS diode sources or the like.

BRIEF SUMMARY OF THE INVENTION

The present invention in at least some embodiments is directed to one or more of 1) an ultra-low dispersion, stable, low-energy (at the emitting surface), ultra-large area Porous Silicon (PS) diode electron source that overcomes the limitations of the prior devices, 2) wide-field electron optics devices that exploit unique features of the PS diode source, and 3) application of the source-optics combination in high throughput maskless lithography as well as several types of electron microscopy.

In one embodiment, a wide-field optics device is capable of performing maskless as well as projection lithography within the same tool without compromising the high throughput target of approximately 50 wafers (300 mm)/hr down to a CD of less than 10 nm. Such an embodiment is capable of providing full die (a few cm on each side) exposure without wafer stage movement, as well as synchronization of multiple source-optics assemblies for higher throughput at lower resource overhead than is possible with conventional techniques.

In at least some embodiments of the invention, the PS diode electron source is formed by photo-anodization of doped n+ Si(100) wafer in aqueous HF:ethanol solution. When such a diode is cooled down to 77 K or lower temperature (in the 90 K to 75 mK range) and a forward bias voltage is applied to the diode (e.g., the top electrode of the diode is positive with respect to the back substrate electrode of the diode) in a pulsed manner, a stream of low energy (e.g., less than 0.1 eV) electrons are emitted, where the electrons are emitted without appreciable angular dispersion.

In at least one such embodiment, when the PS diode is operated at an easily attainable liquid nitrogen temperature (77 K), the electron emission is exceptionally stable with less than a 1% rms deviation from pulse-to-pulse (for square pulses with 10 to 20 ms duration and 0.5 to 10 s repetition rate). Additionally, in such an embodiment emission currents of greater than 40 nA/cm$^2$ can be obtained without degradation, and the energy distribution of the emitted electrons is non-gaussian in nature resulting in greater than 95% of the electrons having less than 0.1 eV in energy at the top electrode. These properties are ideally suited for high throughput maskless lithography using electrons.

Further with respect to the above-described embodiment, and in contrast with conventional devices, the emission from the PS diode is stable without degradation or deterioration over months of continuous pulsing (e.g., with approximately 0.5 s delays between pulses) or storage under normal room conditions, so long as the diodes are never operated well above 77 K. For these sources, both emission current ($I_E$) and diode current ($I_{PS}$) show exponential dependence on the bias voltage ($V_{PS}$). Exponential dependence of $I_E$ on $V_{PS}$, coupled with strong dependence of $I_E$ on accelerating potential ($V_{acc}$) allows precise control of the fluence for grey scaling as well as synchronization of several sources. In addition, $I_E$ is not affected up to a few torr of inert gas pressure in the source chamber.

In at least some other embodiments, fluence of the source and the optical field are increased by forming a PS diode structure on an ultra-large area that is any of planar in shape, spherical in shape, ellipsoidal in shape, paraboloid in shape, or hyperboloid in shape, or that has a shape that is any of a variety of other surfaces of revolution carved into an ingot of n+Si. By combining such structure with a suitable wide-field optics device developed specifically for the large area, low initial energy source, several problems associated with conventional point source optics devices mentioned above can be circumvented.

In at least some embodiments, high quality diodes are manufactured from low cost raw materials (e.g., from semiconductor grade ingots up to 300 mm in diameter or even up to 400 mm for specialty applications), and through the use of conventional Si technologies and standard optical methods, for example, to uniformly illuminate surfaces during photo-anodization. The top electrode of each diode is patterned into several arc lengths with variable widths and lengths while maintaining cylindrical symmetry. With common substrate potential, each arc (herein referred to as a "radial element") connected to the power supply individually via a thin wire glued to a corner of the arc forms a respective individual electron emitter when positively biased.

In such embodiments, neighboring radial elements are separated from one another by semi-insulating gaps, which can be made as small as possible to increase the usable area of the diodes to greater than 90%. During the top Ti/Au or Cr/Au electrode deposition using standard metal evaporation techniques, a suitable contact mask can be used for obtaining the desired top electrode pattern having the multiple radial elements.

In at least some embodiments, the wide-field optics device or "optical column" that can be used in combination with the above-described low initial energy (less than 0.1 eV), pulsed diode source includes several electrostatic immersion lenses formed by a set of hollow cylindrical, conical, spherical, and planar shaped electrodes suitably placed along the optical path of the electrons. A cylindrical axis of symmetry of the source and the lens electrodes defines the optical axis.

In some embodiments of the wide-field optical column, the potentials on lens electrodes are pulsed along with the specific radial elements being pulsed at that moment to obtain the desired control of the trajectories of the electrons emitted from those radial elements. A stream of electrons with a well-defined spatial boundary (herein referred to as a beamlet) results from each radial element due to exceptionally low initial energy of the emitted electrons, such that there is low dispersion in energy at any point along the length of the optical column. The beamlets can be rotated about the optical axis as well as translated radially in a plane perpendicular to the optical axis.

In some embodiments, such a wide-field system is used as a projection lithography tool. In the lithography tool, a mask is placed along the optical axis and can be uniformly illuminated with the beamlets pulsed in a suitable fashion, without any movement of the mask stage. The mask for this projection lithography tool consists of a perforated metal diaphragm where the perforations define the circuit pattern to be transferred to the wafer.

In some such embodiments, additional immersion lenses (called projection lens) are placed between the mask and wafer to allow demagnification (up to 10×) and further control of the "image" information carried by each beamlet. The potentials on various electrodes constituting the projection lens are also pulsed similar to the other, objective lens(es) described above to achieve desired results. In this scheme, the wafer itself becomes part of the lens system. Electrons are continually accelerated in the optical column from 0.1 eV at the source to 10-50 kV at the wafer.

In contrast with conventional systems in which electron energy at the source is approximately 500 eV, embodiments of the present invention having initial energies of less than 0.1 eV can achieve desired beam control at lower lens potentials. This in turn allows easy switching of the potentials at high speed. Throughput for a lithography tool based on large area sources such as those described above can be greater than 2 wafers/hr (where, wafer diameter is 300 mm), per source/lens assembly.

In yet other embodiments, each beamlet such as those described above can be further split into hundreds of sub-beamlets (herein referred to as "pixel-beamlets") by pulsing the voltages on some of the lens elements at 1 kHz to 1 GHz. By programming these pulse sequences, the pixel-beamlets can be further utilized to write desired circuit patterns directly onto wafers. Using this arrangement, massively parallel maskless lithography at a CD of less than 10 nm can be achieved within the same projection tool. Further, due to the absence of stage movement during full die exposure in the wide-field optical column, several source-lens assemblies can be synchronized to achieve greater than 50 wafers/hr (where, wafer diameter is 300 mm) throughput at lower peripheral resource overhead (such as optical communications, digital mask storage, etc.) than in conventional systems.

In some further embodiments, it is possible to achieve a combination of massively parallel maskless lithography and full chip projection lithography within same tool. Such combination embodiments offer unique optimization of the overall lithoprocess in a manner that is unavailable from the conventional lithography platforms.

In still additional embodiments of the invention, an electrostatic immersion lens coupled with conventional magnetic lenses results in a quasi-continuous probe beam from a large area PS diode source. The probe beam has superior beam qualities and offers several advantages over conventional electron beams used in systems such as an SEM (Scanning Electron Microscope). One advantage of such embodiments is that the source itself does not require high vacuum (it can be operated in a few torr of inert gas atmosphere). As a consequence, the applications of the high fluence, low dispersion, stable, pulsed or quasi-continuous probe beam include applications in easy to use SEM, environmental SEM (for the study of biological specimens), LEEM (Low Energy Electron Microscope), Cryo LEEM (LEEM capabilities extended to mK temperature range), and Electron Micro Probe (EMPA) tools.

Further, in at least some embodiments, the present invention relates to a diode structure capable of emitting electrons. The diode structure includes a first layer and a second layer adjacent to the first layer, where the first and second layers form a diode junction. The diode structure additionally includes a third layer adjacent to at least one of the first and second layers, where the third layer is electrically insulative and thermally conductive. The third layer is at least indirectly in contact with a cooling device so that heat flows through the third layer away from the first and second layers, whereby the first and second layers are maintained within a temperature range that is substantially less than 100 degrees Kelvin.

Additionally, in at least some embodiments, the present invention relates to an electron source. The electron source includes a diode structure having an emission surface, and a voltage source that applies periodically-repeating time-varying voltage levels across the diode structure. The periodically-repeating time-varying voltage levels during each of a plurality of periods include a first negative voltage level that is followed by a first positive voltage level that is followed by a second negative voltage level.

Further, in at least some embodiments, the present invention relates to a system for generating and directing electron flow. The system includes an electron source having a plurality of independently-actuatable emission surfaces each of which is capable of emitting electrons, and an optical column adjacent to the electron source through which the emitted electrons pass. The optical column includes a plurality of actuatable electrodes that are capable of influencing paths taken by the emitted electrons.

BRIEF DESCRIPTION OF THE DRAWINGS

A number of features and advantages of the invention will be apparent from the detailed description of some of the preferred embodiments of the invention as illustrated in the following drawings. The drawings, which are not drawn to scale, lay emphasis upon illustrating various principles of the invention rather than upon any particular details.

FIG. 1 is a schematic of one embodiment of PS diode;

FIG. 2A is a graph showing variation in emission current with time for values of $V_{acc}$ ranging from 0 V to 150 V at 77 K;

FIG. 2B is a graph showing variation of a bias voltage $V_{PS}$ across the diode of FIG. 1, as well as variation of the corresponding diode current $I_{PS}$, with time;

FIG. 3 is a plot of the energy distribution of emitted electrons for the diode bias conditions in FIGS. 2A and 2B;

FIG. 4 is a schematic cross-sectional view of a large area PS diode carved into an $n^+$ crystalline silicon ingot;

FIG. 5A is a plan view of an exemplary contact mask used for patterning a top electrode of a large area PS diode;

FIG. 5B is a plan view of a related tile structure of an alternate embodiment of a large area PS diode differing from that of FIG. 5A;

FIG. 11 is an additional graph showing in more detail the exemplary simulated electron trajectories of FIG. 10, near the crossover inside the aperture of the probe beam-forming lens design.

FIG. 12A is a schematic cross-sectional view of a ring-type beamlet that can be formed in certain embodiments of the probe beam-forming lens system of FIGS. 10-11;

FIG. 12B is a schematic of a lower section of the probe beam-forming lens system of FIGS. 10-11, where the lower section is placed below the aperture shown in FIG. 11;

FIGS. 13A-13D are graphs showing exemplary simulated electron trajectories in different configurations of a wide-field electron optical column suitable for use in the projection lithography tool of FIG. 6;

DETAILED DESCRIPTION OF THE PREFERRED EMBODIMENT

Figure 6:
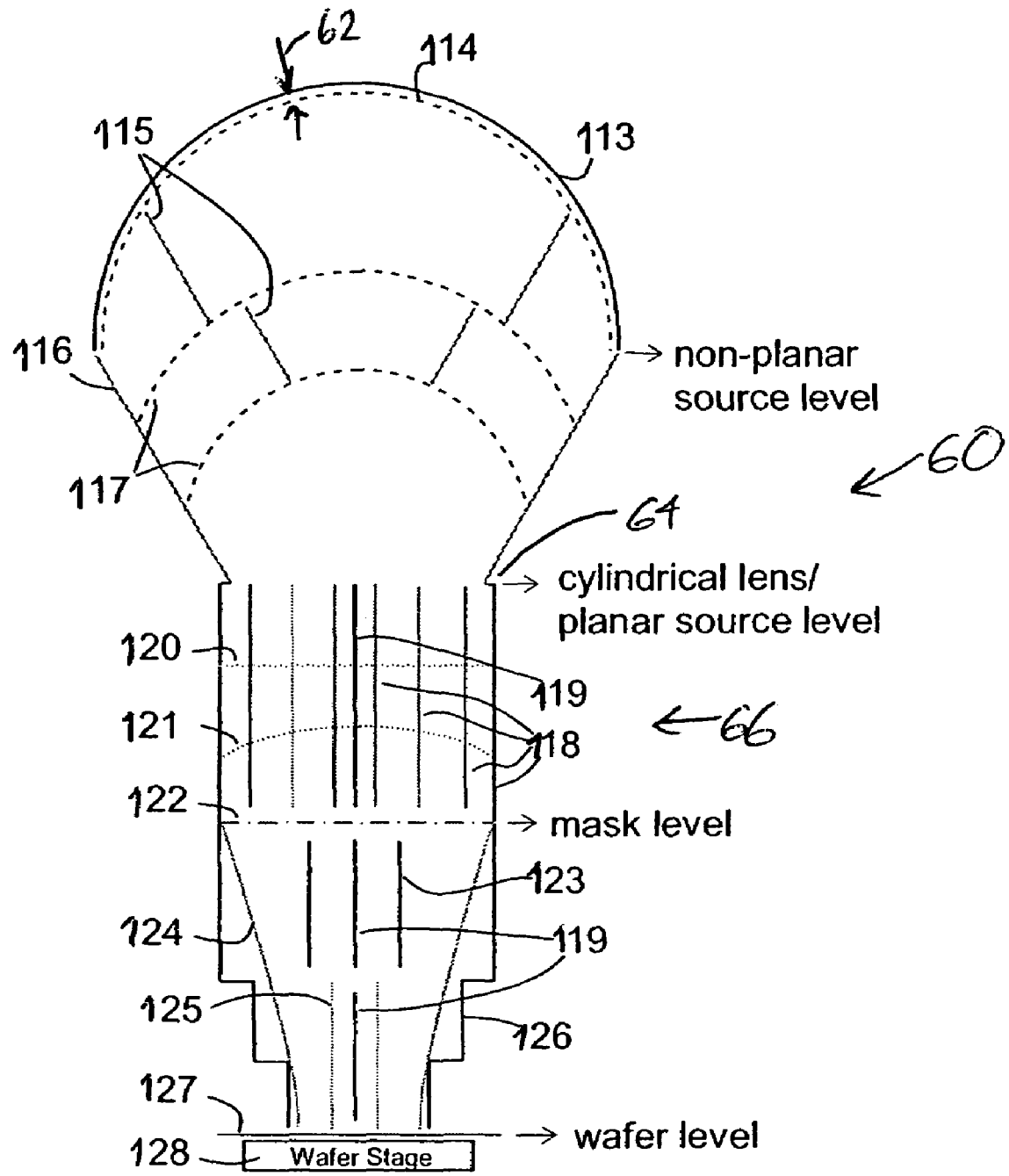
FIG. 6 is a schematic cross-sectional view of a wide-field electron optics device and related lithography platform design.

Referring to FIG. 1, a Porous Silicon (PS) diode electron source 0 in accordance with one embodiment of the present invention is shown in schematic form. The electron source 0 includes a diode structure 51 that is formed by the assembly of several layers of materials including a wafer 3, a porous silicon layer 4, and additional layers discussed below. A junction 53 in particular exists where the wafer 3 interfaces the porous layer 4 adjacent to the wafer. The diode structure 51 having the porous silicon layer (or simply porous layer) 4 is formed by photo-anodization of a doped n+Si(100) wafer 3 (0.005-0.02 Ohm-cm) in a 48% to 50% aqueous HF:ethanol solution with 1:1 concentration, for 20 to 40 s under a white halogen light source with 10 to 14 mW/cm$^2$ intensity near the wafer's surface. The anodizing current density is 30 to 35 mA/cm$^2$. In addition, the wafer 3 is treated by RTO (rapid thermal oxidation) in a turbulence-free flow of dry oxygen at 900 C. for 5 to 6 min.

Additionally, the diode structure 51 includes a metal contact (ohmic) material (not shown) that is evaporated onto the back of the wafer 3 and a 10/70 Å of Cr (or Ti)/Au layer 5 is deposited on top of the porous layer 4. The layer 5 forms a top electrode of the diode 51. Because both the layer 5 and the underlying porous layer 4 (which is approximately 0.5 μm thick) are very fragile, a thin metal wire 52 (shown schematically) is glued to the surface of the layer 5 with conductive paste rather than wire bonded, in order to provide electrical connectivity to the power supply. The layer 5 could be, for example, made from Gold, Tungsten, or Aluminum.

In the present embodiment, the diode structure 51 further includes a Cu base plate 1 and a sapphire block 2. The base plate 1 is in direct contact with a thermal bath 54 of the electron source, where the thermal bath can be, for example, a liquid nitrogen bath. The sapphire block 2 is placed between the wafer 3 and the base plate 1. Although not shown in FIG. 1, the sapphire block 2 has a gold layer thermally evaporated onto its top surface that is electrically connected to the wafer. Excellent thermal grounding is achieved when the wafer 3 with its back Au electrode is in electrical contact with the Au layer on the sapphire block 2, which is mechanically clamped to the base plate 1. Although various metals and other materials are mentioned above (and below) for use as layers 3, 4, 5 and other structures, it should be understood that a variety other metals and materials than those mentioned could also be used. In at least some embodiments, the diode structure is physically of large area, for example, the emission surface of the diode structure can be on the order of several hundred or thousand (e.g., at least two thousand) square cm in area or more.

The electron source 0 including the diode structure 51 is operated as follows. When the diode structure 51 placed in partial vacuum of a few torr or less (e.g., approximately 5 torr or less) of inert gas atmosphere is cooled down to 77 K (within the 90 K to 75 mK range) with the help of thermal bath 54 and additionally a forward bias voltage $V_{PS}$ is applied to the diode structure (e.g., with the top electrode formed by the layer 5 being positive with respect to a back substrate electrode formed by the wafer 3) a stream of low energy electrons without appreciable angular dispersion is emitted into a partial vacuum 8 of the electron source 0. Additionally, when a metallic collector electrode 7 and a guard ring 6 of the electron source 0 are biased at $V_c$ and $V_g$, respectively, a net accelerating voltage $V_{acc}=V_c-V_{bias}$ is experienced by the emission electrons. Under such bias conditions, electrons emitted from the diode structure 51 experience not only the accelerating field (from $V_{acc}$) but also experience fringe fields from the diode substrate (e.g., the portion of the wafer 3/porous layer 4 that is not covered by the top electrode formed by the layer 5), as well as fields from the image charge of the electrons in the top electrode formed by the layer 5.

Referring to FIGS. 2A and 2B, in one particular embodiment, the diode structure 51 of FIG. 1 includes a 13 mm diameter porous layer 4 etched at the center of a 17×17 mm n$^+$Si chip wafer 3, where the Ti/Au layer 5 forming the top electrode (which is concentric with the porous layer 4) is 11 mm in diameter and 8 nm thick. Given this particular embodiment of the diode structure, FIG. 2A provides a graph showing exemplary time variation of a range of emission currents $I_E$ that are generated for different values of $V_{acc}$ ranging from 0 V to 150 V.

To achieve the time variation of emission currents $I_E$ shown in FIG. 2A, the forward bias voltage $V_{PS}$ applied across the diode structure 51 must be pulsed as shown in FIG. 2B. In particular, as shown, the forward bias voltage $V_{PS}$ is controlled such that, over a period of approximately 50 milliseconds, the bias voltage is first controlled to a take on a negative voltage (e.g., about −8 V) during the first approximately 4 ms, then is controlled to take on a positive voltage (e.g., about 12.5 V) during these second approximately 20 ms, further is controlled to take on a negative voltage again (e.g., about −7 V) during the subsequent approximately 18 ms, and finally is controlled to take on a zero value during the remaining 8 ms of the period, after which the cycle is repeated. FIG. 2B also shows the resulting current $I_{PS}$ that flows through the diode structure 51 (which is different from the emission current $I_E$ generated by the electron source 0) as the variation in forward bias voltage $V_{PS}$ occurs. As shown, during the approximately 20 ms-long forward biasing of 12.5 V, $I_{PS}$ is approximately 35 mA. The current through the diode during the remaining time with reverse biasing of approximately −8 V is less than 50 μA.

For the particular pulse shape shown in FIG. 2B for $V_{PS}$, the resulting emission currents $I_E$ generated within the electron source 0 are stable over several hours of continuous pulsing, where the delay between successive pulses can be as low as 0.5 s. Due to excellent thermal grounding, no heating induced variations in conduction (or emission) are observed. Under these conditions, the emission currents $I_E$ are stable to within approximately a 1% rms deviation for pulse widths (e.g., where $V_{PS}$ takes on positive values) ranging from 10 to 40 ms and a pulse delay 0.5 to 10 s. Unlike the prior art, the emission is stable without degradation or deterioration over months of continuous pulsing (with approximately 0.5 s delay between pulses) or storage under normal room conditions, as long as the PS diode electron sources 0 are never operated well above 77 K.

Turning to FIG. 3, a graph 55 shows the energy distribution of the emitted electrons for the embodiment described above with reference to FIGS. 1, 2A and 2B when $V_{acc}$ is less than 30 V. This distribution clearly shows that greater than 95% (even as high as 98 or 99% for $V_{acc}$ greater than 30 V) of the electrons that are emitted have energies of less than 0.1 eV. Thus, the emitted electrons are almost entirely monochromatic/monoenergetic. In circumstances where $V_{acc}$ exceeds 30 V, even lower energy electrons in the distribution are extracted, as $I_E$ at $V_{acc}$=150 V is more than three times the value at $V_{acc}$=30 V. Further details of the device operation, physical properties and principles, theory of operation, and emission characteristics of these devices can be found in "A porous silicon diode as a source of low energy free electrons at milliKelvin temperatures", by S. Pilla, B. Naberhuis, and J. Goodkind in the Journal of Applied Physics, Volume 98, pages 1-7 (2005), which is hereby incorporated by reference herein.

Turning to FIG. 4, a schematic cross-sectional view is provided of a large area PS diode structure 100 carved into a cylindrical n$^+$ Si ingot 103, with a porous layer 104, a top electrode layer 105, and a block 102 (such as a sapphire block). The block 102 provides electrical isolation between the ingot 103 and a base plate 101 made of OFHC (Oxygen Free High Conductivity) copper (or a similar material), which is in thermal contact with a low temperature thermal bath (not shown), such as liquid nitrogen bath. Although electrically isolative, the block 102 provides excellent thermal grounding of the diode structure 100, particularly between a flat surface 106 of the ingot 103, and the base plate 101. In the embodiment of FIG. 4, the base plate 101 serves as part of the vacuum enclosure in which the diode source and the rest of the wide-field optical device (or simply "optical column") is housed. The diode structure 100 can be fabricated in a manner similar to that discussed with respect to the diode structure 51 of FIG. 1. As discussed further with reference to FIG. 5, the top electrode layer 105 in the embodiment of FIG. 4 is not a continuous surface but rather is a set of protrusions that are separated from one another by small gaps 107.

The diode structure 100, with its elements 101-105 shown in FIG. 4, constitute one embodiment of the diode structure 51 of FIG. 1, with its elements 1-5, respectively. In particular, an emission surface 108 of the diode structure 100 has a rounded cross-section as shown, and is generally spherical in shape. While the diode structure 51 of FIG. 1 is intended to be representative of the diode structure 100 shown in FIG. 4, the diode structure 51 of FIG. 1 is also intended to be representative of numerous other diode structures with different characteristics than those of the diode structure 100. For example, the diode structure 51 is intended to be representative of diode structures with emission surfaces that are ellipsoidal in shape, paraboloid in shape, or hyperboloid in shape, or that have shapes that are any of a variety of other surfaces of revolution carved into an ingot of n+ Si. Also for example, the diode structure 51 is intended to be representative of diode structures that have planar emission surfaces, or other large area emission surfaces.

The top electrode layer 105 of the diode structure 100 of FIG. 4, with its protrusions separated by gaps 107, is patterned by way of evaporation of metal using a thin contact mask 109 shown schematically in FIG. 5A. As shown, the white or transparent portions 110 are openings in the mask 109, where the metal for the top electrode layer 105 is deposited on the porous layer 104. Further, the dark portions 111 show where the metal top electrode layer 105 will be discontinuous, that is, where the gaps 107 will be formed. In the present embodiment, the portions 110 take the form of arcs of various arc lengths. Although the mask 109 shown is used to develop a generally spherical top electrode layer 105, even for non-planar diode surfaces (such as spherical, ellipsoidal, paraboloid, hyperboloid or any other surfaces of revolution), the contact mask 109 can be fabricated to match the inside shell surface during metal deposition.

Depending upon the embodiment, several types of masks can be made to suit different applications by varying the arc lengths, and widths of the open portions and blocked portions (e.g., the open portions 110 and blocked portions 111) of the mask. As shown in FIG. 5B, in one alternate embodiment of large area diode structure 100, tiles 112 in the shape of circular arcs with suitable radii and widths can also be used to assemble large non-planar surface emitters. The white or transparent portions of the tiles 112 indicate the top electrode pattern of the tile. A cross-sectional view taken along the line II-II of FIG. 5B would provide a view similar to the stack shown in FIG. 1 and encompassing elements 1 to 5. Several of the tiles 112 glued with conductive cement (both thermal and electrical) inside a metal shell of a suitable surface of revolution will be similar to the schematic cross-section of FIG. 4.

From the above discussion, it should be apparent that the present embodiments of diode structures discussed with reference to FIGS. 4, 5A and 5B have top electrode layers 105 that are formed, overall, by way of an assemblage of numerous arcs, which hereinafter will be referred to as "radial elements". As discussed further below, in accordance with at least some embodiments of the present invention, the emission of electrons from each of the radial elements can be controlled independently of the emission of electrons from all of the other radial elements. Thus, each radial element can be pulsed on and off independently of all of the others. The overall emission effect of the combination of radial elements can still be significant, notwithstanding their being independently switched on and off. In the embodiment of FIG. 5A, for example, if each radial element is pulsed once every 0.5 s, and the emission current density is 40 nA/cm$^2$, the total fluence and wafer throughput for a hemispherical source of diameter D=450 mm is approximately 2.5 µC/s and 3.25 wafers/hr (where, wafer diameter is 300 mm).

FIG. 6 shows a schematic cross-sectional view of one exemplary embodiment of a wide-field optical device (hereinafter referred to as an "optical column") 60 which can be implemented using the diode structure 100 of FIG. 4. The optical column 60 is housed in a vacuum chamber (not shown). The diode structure 100/large area electron source assembly of FIG. 4 is indicated as 113 and, typically during operation, a few radial elements of the diode structure 100 are selectively pulsed on and off (e.g., according to the pattern discussed with reference to FIGS. 2A and 2B at any given time while all other elements remain dark. When radial elements of the diode structure 100 are respectively pulsed on, the respective radial elements emit arc-shaped patterns of electrons (hereinafter referred to as "beamlets") that are then directed through a series of wire mesh electrodes or grids 114, 117, 120 and 121 down the optical column 60 by a series of additional electrodes or electron lenses 115, 116, 118, 119, 123, 124, 125 and 126 through a mask 122 and subsequently toward a wafer 128.

In addition to the pulsing of the radial elements of the diode structure 100 to generate the beamlets, the parameters (e.g., the analog voltages) on the different electrodes 115, 116, 118 and 123-126, as well as on the mask 122, are also pulsed to focus the beamlets in desired manners based upon electron trajectory calculations, testing and verification. Because each beamlet is "turned-on" for only a few ms, and because present state-of-the-art power supplies can change voltages at a rate of 360 V/µs, the delays between successive beamlets can be negligible. Consequently, large usable beam currents formed from the multiple beamlets can be achieved without the fundamental limitations imposed by stochastic processes, both in terms of the fluence of the beam current and the effective diameter of the illumination field.

In the particular embodiment of FIGS. 4 and 6 employing the hemispherical large area electron source assembly 113, the wire mesh electrode 114 is a fine wire mesh grid with greater than 80% transparency that is placed close to the emission surface to provide an initial acceleration field as well as to control the angular dispersion of the beamlets. Desired control can be achieved by maintaining the potential of the top electrode layer 105 as close as possible to the potential at the substrate formed by the ingot 103, with the exception of the one (or possibly more than one) radial element that is intended to be turned on. The fringe fields thus generated are used to obtain the first crossover of the beamlet below the wire mesh electrode 114. $I_E$ decreases exponentially with decreasing $V_{PS}$, and so the voltages on the dark (or off) radial elements can be varied over a certain range to control the characteristics of this crossover.

The wire mesh electrodes 114, 117, 120 and 121 are extend in manners that are generally perpendicular to the flow directions of electrons emitted from the electron source assembly 113. The wire mesh electrodes 114 and 117 in particular are in the present embodiment generally spherically (or hemispherically) shaped. In particular with respect to the electrode 114, to be effective, a gap 62 should exist between that electrode and the top electrode layer 105 of the electron source 113. The gap 62 should be comparable in size to the average width (e.g., the shorter dimension) of the radial elements, that is, comparable in size to the average width of the open portions 110 that defined the radial elements. The potential difference between wire mesh electrode 114 and the radial element(s) provide the necessary $V_{acc}$, which in turn controls the beam fluence as discussed with reference to FIGS. 2A and 2B. The spherical electrodes 117 as shown actually include several separate, generally concentric electrodes of different diameters. The electrodes 117 are in the form of wire mesh or pre-formed thin metal foil (typically with greater than 80% transparency), such that the entire spherical surface of each respective electrode is held at the same potential. In addition, the potentials on the electrodes 117 are held constant for all radial elements.

With respect to the electrodes 115 and 116, these electrodes are thin conical electrodes that are used to bend the electron trajectories in each beamlet. The conical electrodes 115 as shown actually include several separate, generally coaxial electrodes of different diameters, apex angles and apex positions along the optical axis. In contrast to the potentials applied to the spherical electrodes 114 and 117, the potentials on the conical electrodes 115 and 116 are changed depending on the radial element that is being selected or turned on at any given moment, such that all electrons will have the same (or approximately the same) energy when they reach the level of the mask 122. Although FIG. 6 shows the optical column 60 designed for use with a hemispherical electron source 113, FIG. 6 also shows how the optical column could be redesigned in the case of a planar source. As shown, in such case, the planar electron source and planar wire mesh electrode (similar in function to the wire mesh electrode 114 and also spaced apart from the planar electron source by a gap such as the gap 62) would be placed at a planar source level 64 as indicated in FIG. 6.

Below the planar source level 64 shown in FIG. 6, the optical column 60 has several additional electrodes/lens and other components. These components would be the same regardless of whether the optical column 60 was designed for use with a hemispherical electron source as shown or with a planar electron source as mentioned above. As shown, below the level 64, a cylindrical immersion lens 66 is defined by the combination of the several electrodes 118 that are generally in the form of concentric, thin-walled cylinders (e.g., cylindrically symmetric) and additionally the electrode 119 that is a cylindrical wire or rod extending along a central optical axis of the optical column 60 and that is less than 1 mm in diameter.

Further, the additional electrodes 120,121 are positioned below the planar source level 64 and above the level of the mask 122. The electrodes 120,121 (or several of them) are shown to be planar and spherical wire mesh electrodes, respectively, placed at various elevations in the cylindrical immersion lens 66. The electrodes 120,121 have greater than 80% transparency, and are similar in function to the electrodes 117. Presence of semitransparent wire mesh electrodes/grids in the path of the electrons does not pose any problems because the beam energy is less than 1 keV above the level of the mask 122 in the present design.

The space between the mask 122 and the electron source 113 can be referred to as the "object space" of the optical column 60. It is within this object space that electrons can be steered and accelerated before they reach the level of the mask 122, akin to optical lithography systems. Wide field electron optics results when the potentials on the various electrodes 114-121 in the object space are pulsed based on electron trajectory calculations to steer and focus each beamlet in the desired fashion. These potentials can be quickly adjusted and precisely fine tuned (e.g., in less than 1 μs) for each radial element, resulting in a wide field electron beam for "full chip" projection.

In the present embodiment, only the electron source 113 needs to be maintained at liquid $N_2$ temperature (77 K) by thermally anchoring the base plate 101 (see FIG. 4), which serves as part of the vacuum chamber mentioned earlier. The remainder of the system including the optical column 60, the mask 122, and wafer 128 remain at room temperature. More specifically, such a temperature differential is achieved by attaching a liquid nitrogen reservoir to the base plate 101. The entire system including the base plate 101 is then inserted into a long metal tube (not shown), to provide a vacuum as well as isolate the system from external environment. Gate valves (not shown) can be placed along the length of the outer tube to access the mask and wafer stages 122,128. The mask 122 and wafer 128 can be aligned in the optical column 60 by coarse mechanical adjustment of the mechanical stages.

The various electrodes of the optical column 60 are provided with electrical isolation as appropriate to allow for their separate actuation. The points at which such electrical isolation is provided between electrodes along the optical column can also serve as thermal isolation points, along with the long vacuum space between the electron source 113 and the mask/wafer stages 122,128. Thus, no special heaters are necessary to warm up the masks or wafers before they are unloaded from the tool. The object space within which the electrodes/lenses operate additionally requires good magnetic screening from external sources. A multi layer mu-metal shielding positioned around the optical column 60 can be used to provide such magnetic screening. Additionally, in terms of physically supporting the various electrodes within the optical column 60, the different electrodes that are placed one inside the other (such as the electrodes 118,119) are supported by several strategically placed, thin, non conducting struts along which run electric signal lines/thin fiber optic bundles to actuate the electrodes (not shown).

In addition to the object space discussed above, the present embodiment also includes an "image space" below the level of the mask 122 and above the wafer 128. The image space, which is several centimeters long in the present embodiment, includes several electrodes of type 123, 125, which are two concentric cylindrical electrodes similar in design to the electrode 118. The present embodiment further includes one or both of the electrode 124, which is a cylindrically symmetric (or conical) electrode, and the electrode 126, which is a step ladder type cylindrical. Further, the image space also includes an extension of the wire/rod electrode 119 extending within the object space. The electrodes 123-126, 119 between the levels of the mask 122 and the wafer 128 constitute the "projection lens" of the optical column 60. No wire mesh electrodes such as the electrodes 120,121 exist in the path of the beamlet as part of the projection lens, because the electrons traveling within the region are of high energy. Similar to the mask (in a projection tool), the wafer 128 is maintained at a high potential (e.g., greater than 20 kV), thereby making it a part of the projection lens.

Although with reference to FIG. 6 various cylindrical, conical, and cylindrically-symmetric electrodes are discussed above, it should be understood that various electrodes of a variety of different shapes could be used in different embodiments. For example, rather than being strictly cylindrical or conical, the electrodes used could merely be surfaces of revolution of arbitrary shape (e.g., any surface defined by rotating any curve of arbitrary shape around an axis or that is cylindrically symmetric), or even portions of surfaces of revolution of arbitrary shape. Indeed, the electrode 124 shown in FIG. 6, while substantially conical, actually has a cross-section that has a slight curvature to it as will be evident upon close inspection of that figure.

Likewise, the various planar, spherical and/or spheroidal wire mesh electrodes (as well as the shape of the electron source or electrode, the shape of the mask, the shape of the wafer, etc.) discussed above are also intended to be exemplary, and could be replaced with other electrodes (or structures) of arbitrarily-shaped surfaces, including surfaces that are at least largely or substantially planar, spherical and/or spheroidal. Thus, the present invention is intended to encompass a variety of optical columns having a variety of different electrodes of different shapes. As will be discussed in further detail below, typically one or more of the electrodes within an optical column will have surface(s) that are at least largely or substantially perpendicular to paths followed by at least some of the electrons emitted from the electron source through the optical column, while one or more others of the electrodes within the optical column will have surfaces that are at least largely or substantially parallel to the paths followed by at least some of the emitted electrons.

The voltages applied to the cylindrically-symmetric electrodes 123,125, along with those applied to the other electrodes 115, 116, 118, 119, 124 and 126, are dynamically adjusted within a few μs based on the lookup tables for the particular beamlet(s) pulsed at a given time. The voltages on these electrodes can be up to ±500 V, but the voltage changes required for controlling the electrons emitted by adjacent radial elements will be rather small (e.g., less than 10 V). Thus, by purely electrostatic control, demagnification of the image by up to a factor of 10 is possible. That is, for example, a beamlet defined by $(r_0, \phi_0, \Delta r)$ at the level of the mask 122 (where $\Delta r$ is the width of the beamlet) can be reduced to a substantially smaller-dimension beam (e.g., $r_0/10, \phi_0, \Delta r/10$) at the level of the wafer 128. Although most of the resists used in lithography do not conduct electricity, a thin layer of Au or Al is deposited, to increase the conductivity as well as to reduce the charging effects in the resist.

Figure 7A:
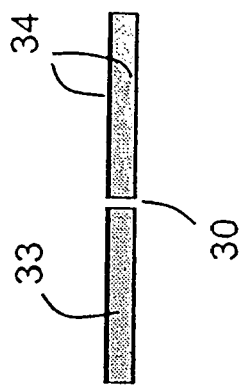
FIGS. 7A-7D are exemplary mask set designs for efficient use of beam fluence in projection lithography, with FIGS. 7B and 7C in particular being a pair of complementary mask set designs that together result in the same wafer pattern as the mask set design of FIG. 7A.
Figure 7B:
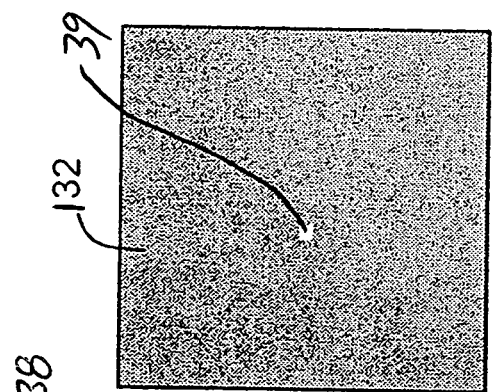
Figure 7C:
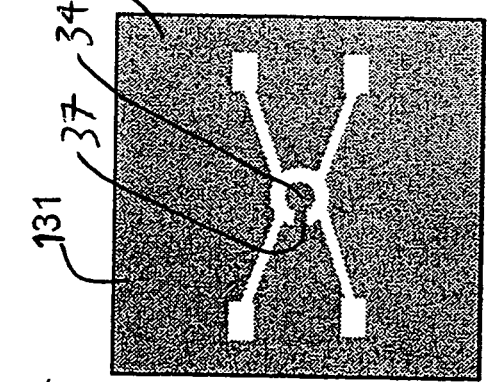
Figure 7D:
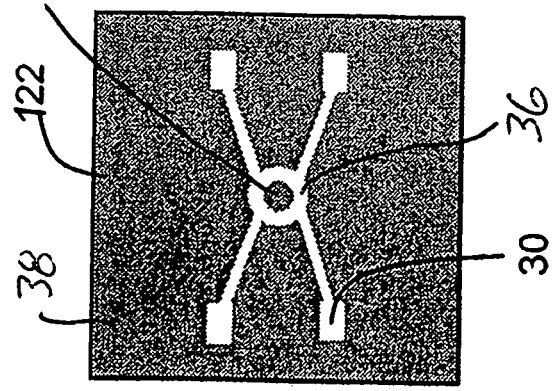

Turning to FIGS. 7A-7D, the mask 122 used in the optical column 60 will vary depending upon the embodiment and upon the particular device that is being created on the wafer 128. In certain embodiments of the present invention, the optical column 60 forms part of a full chip, wide-field projection tool that can be utilized to create a wide variety of integrated circuits and other microchip-type devices including, for example, microprocessors, programmable logic devices, and application-specific integrated circuits (ASICs). Generally speaking, the masks used to create such integrated circuits can take a form such as that shown in exemplary fashion by FIGS. 7A-7D. That is, in such embodiments (particularly as shown in FIG. 7D), the mask 122 includes an electrically conductive membrane 134 supported by a conducting substrate 133 such as a doped Si wafer, with openings 130 in both the membrane as well as the substrate that form the actual pattern to be lithographed. In alternate embodiments, the mask 122 could be formed solely by way of the membrane, which in such embodiments would be self-supporting. The overall thickness of the mask 122 can be several tens of micrometers. Both positive as well as negative masks can be fabricated using RIE (Reactive Ion Etching), anisotropic Si etching, or e-forming processes.

The thickness of the mask 122 is chosen such that a large mask (up to 25 cm on side) does not sag under its own weight when supported at its rim. Depending on the particular circuit pattern, several struts or cantilevers can be etched so that overall effective thickness of the mask 122 is lowered near critical circuit patterns while providing sufficient mechanical strength. In certain embodiments, a "donut problem" can occur due to the pattering of closed forms. For example, as shown in FIG. 7A, it is desired that the mask 122 define a circuit pattern 30 and in particular provide a blocking portion 34 so as to define a ring-shaped gap 36 as part of that circuit pattern. However, the blocking portion 34 is entirely surrounded by the gap 36 so as to be entirely separated from the remaining portion 38 of the mask.

One manner of resolving the "donut problem" illustrated by FIG. 7A is shown in FIGS. 7B and 7C. As shown in FIGS. 7B and 7C, respectively, the mask 122 can be resolved into two complementary masks 131,132. The first of the complementary masks, mask 131, defines all of the desired pattern 30 except for a bridge portion 37 connecting the blocking portion 34 with the remaining portion 38. The second of the complementary masks, mask 132, in turn blocks all electrons except for electrons passing through a small opening 39 corresponding to the bridge portion 39.

Despite the use of two such complementary masks 131, 132, wafer throughput through the system is not significantly adversely affected. The complementary masks can be fabricated such that one of the complementary masks (e.g., the mask 132) has maximum opacity and the other (e.g., the mask 131) has minimum opacity. The coarse coordinates of the relatively few openings in the maximum opacity mask 132 can be known prior to implementation, and the projection tool can be programmed to illuminate only the area surrounding the openings to significantly decrease the fluence required and increase throughput. Thus, in an assembly line environment, if ten tools were set up to illuminate the mask 131, only one tool at the end of the line would need to be set up to illuminate the mask 132. In further alternate embodiments, more than two complementary masks could also be used.

Figure 8B:
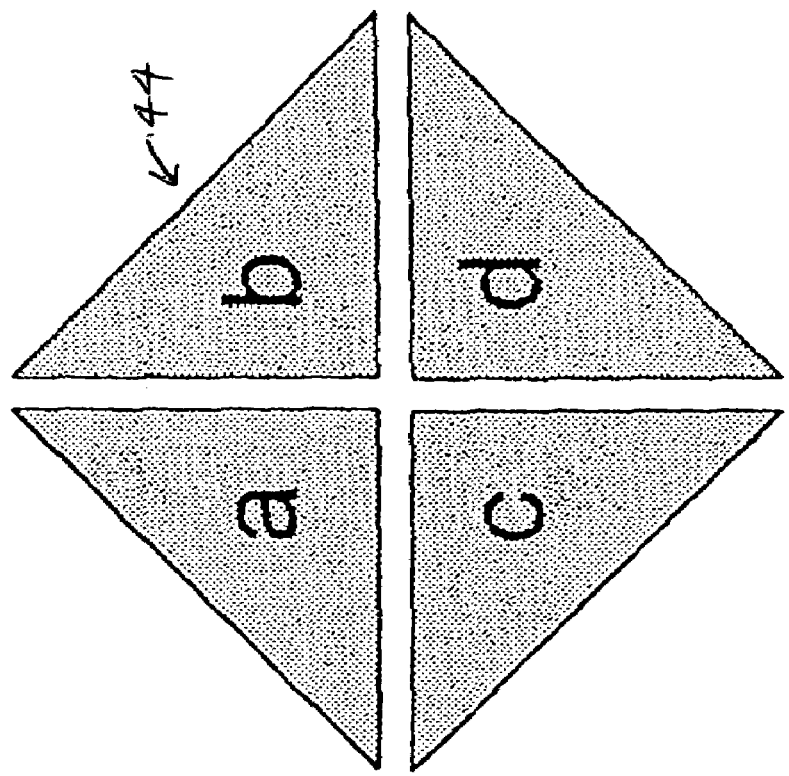
FIGS. 8A and 8B show exemplary masks for use in a projection tool, where each mask is formed from several well-separated parts that are stitched during demagnification and wafer exposure.
Figure 8A:
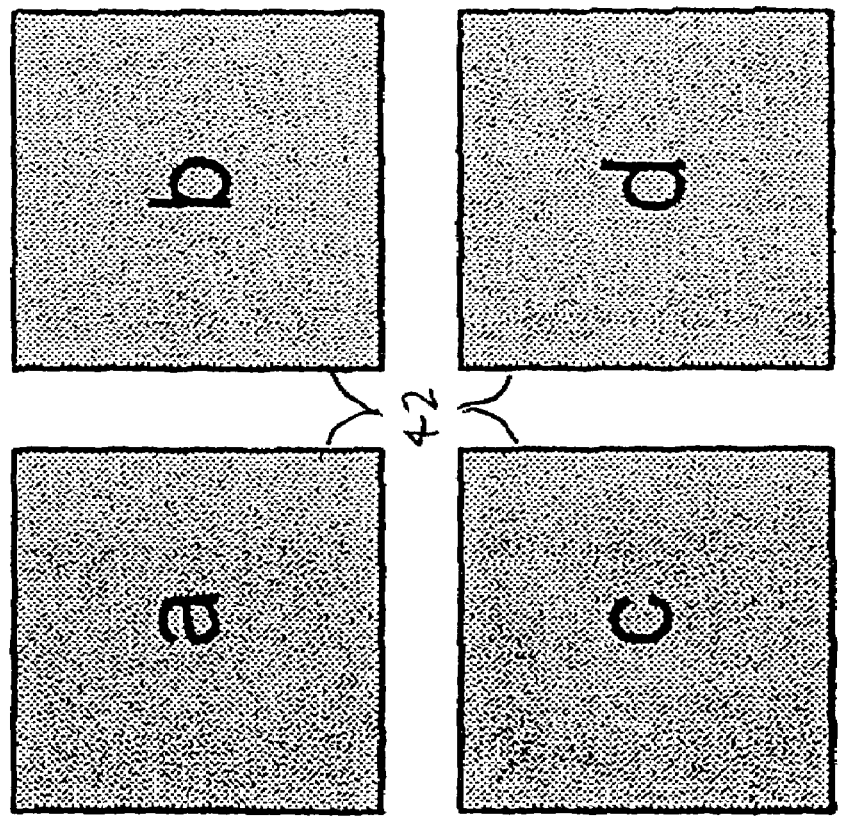

In additional embodiments of wide-field projection tool formed by the optical column 60 of FIG. 6, an overall combination mask can be formed by way of aligning and stitching together several submasks. For example, as shown in FIGS. 8A and 8B, four rectangular submasks 42a-d or triangular submasks 44a-d, respectively, could be assembled together to form an overall pattern based upon the patterns of the individual submasks. Such a procedure would be feasible in particular during demagnification. For example, the entire combination mask could be maintained at 1-5 keV thus making the combination mask into an electrode and effectively into an integral part of the projection lens. Because of the low energy of the electrons and relatively low intensity at the mask, the energy dissipated in the mask is very small (e.g., approximately 1 mW). The positive potential on the mask also eliminates any secondary electrons (typically less than 100 eV) generated at the sharp corners of the openings in the mask. The relatively large (e.g., several cm) distance between the mask 122 and wafer 128 eliminates wafer proximity problems.

Although not shown in FIGS. 8A and 8B, in certain embodiments, a mechanical loading stage with a gate valve and a coarse alignment mechanism can be placed at the level of the mask 122. A shutter is further placed at the level of the mask that can used to cover selected regions of the mask (e.g., one or more of regions 42a-d or 44a-d shown in FIGS. 8A-8B) for mechanical or electrostatic beam-blanking (not shown).

Additionally, in some embodiments, a pixellized MCP (Micro Channel Plate) detector (e.g., an MCP detector with its surface divided into pixels) with each pixel connected to a preamplifier for detecting incident beam current over a small area can be loaded instead of the mask 122 at the level of the mask, for automatic calibration of fluence in each beamlet and registration of radial elements with respect to global symmetry axes. In such embodiments, the detector images the local electron flux density in a manner similar to the operation of a CCD sensor in a digital camera. Such a device would be useful for self-calibration of the wide-field projection tool, as well as to auto-program (via, for example, a microcomputer and a DAQ interface) the power supplies that control various electrodes/lenses that in turn affect the fluence over a specific area at the level of the mask.

As noted above, coarse alignment devices (e.g., mechanical alignment devices) for positioning/aligning the mask 122 and the wafer 128 can be placed at the levels of those components. Because the projection tool of the present embodiment is a wide-field design (with wide-field electrodes/ lenses), secondary electron detectors such as Everhart-Thornley detectors for imaging the alignment marks inside the main (projection?) lens space of FIG. 6 are not feasible. Instead, a smaller electron source (not shown) based on the same PS diode design as the diode structures 51,100 discussed above (having lower fluence along with its own optics), along with a suitable electron detector (also not shown), are attached to the main frame of the optical column 60 for reading the alignment marks. Relative orientations of the mask 122 and wafer 128 are obtained with respect to global axes from the measurement of the alignment marks using such a subassembly. The electrode/lens power supplies are then programmed such that the image is translated or rotated within the full-chip field, without recourse to mechanical stage motions. Using such a design, coarse (mechanical) movement devices are required only to move a wafer from one chip location to another in a raster fashion. During the full-chip exposure, stages need not move.

Figure 9:
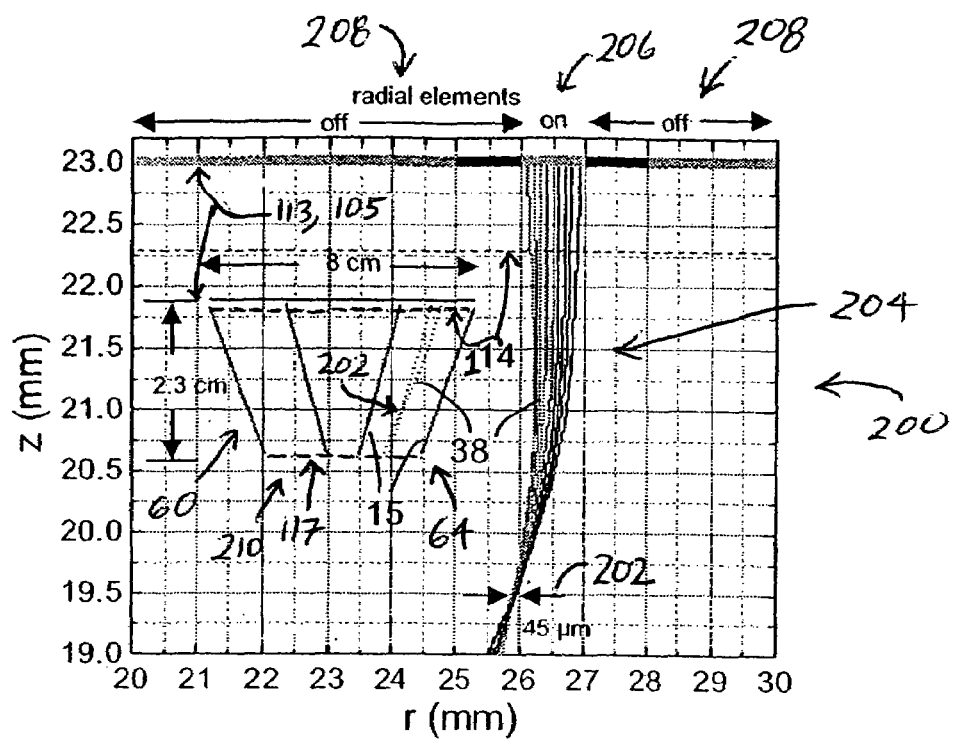
FIG. 9 is a graph showing exemplary simulated electron trajectories demonstrating a first crossover of a beamlet.

Turning to FIG. 9, a graph 200 (including a reduced-size schematic 210) shows exemplary simulation results demonstrating a first crossover 202 of an exemplary beamlet 204 that occurs below the wire mesh electrode 114 of FIG. 6. As shown, the beamlet 204 is generated due to the switching on of a corresponding radial element 206 of the electron source 113. The first crossover 202 is achieved with the help of fringe fields generated by the switching-off (e.g., darkening) of the other radial elements, particularly neighboring radial elements 208 adjacent to the radial element 206. Experiments on PS diodes have shown that, when a radial element is biased at $V_{PS}=+12.5$ V (e.g., as shown in FIG. 2B) to turn it on, the radial elements that are turned off can be biased in the −8 to +9 V range. In FIG. 9, the radial elements 208 labeled "off" are biased 0 to 9 V while the radial element 206 labeled "on" is biased 12.5 V. The electron trajectories are calculated assuming initial energy of each electron to be less than 0.1 eV and angular dispersion to be ±5 degrees, while taking image forces into account when the electron is very close to the surface of the diode structure/electron source 113.

As shown by the graph 200 as well as the reduced-size schematic 210, the diode structure/electron source 113 to which the simulation results correspond in particular is a source having cylindrically symmetric radial elements that are each 1 mm wide and that span a circular diode structure 8 cm in diameter. The wire mesh electrode 114 held at +40 V is 0.7 mm below the top electrode 105 of the diode structure/ electron source 113. The reduced-size schematic 210 in particular shows a cross-sectional schematic view of a portion of the optical column 60, above the cylindrical lens/planar source level 64, in which are located two conical electrodes 115 with a 120 degree apex angle and a bottom wire mesh electrode 117 held at 100 V. The width and energy of the beamlet 204 at the first crossover 202 are approximately 45 μm and approximately 27 eV, respectively. It should be understood that, during operation of the embodiment shown in FIG. 9, the different beamlets produce by the turning on and off of the different radial elements (e.g., the radial elements 208 instead of the radial element 206) will typically take different paths than the beamlet 204, and the crossovers for those different beamlets will also typically occur at different locations than the crossover 202.

Figure 10:
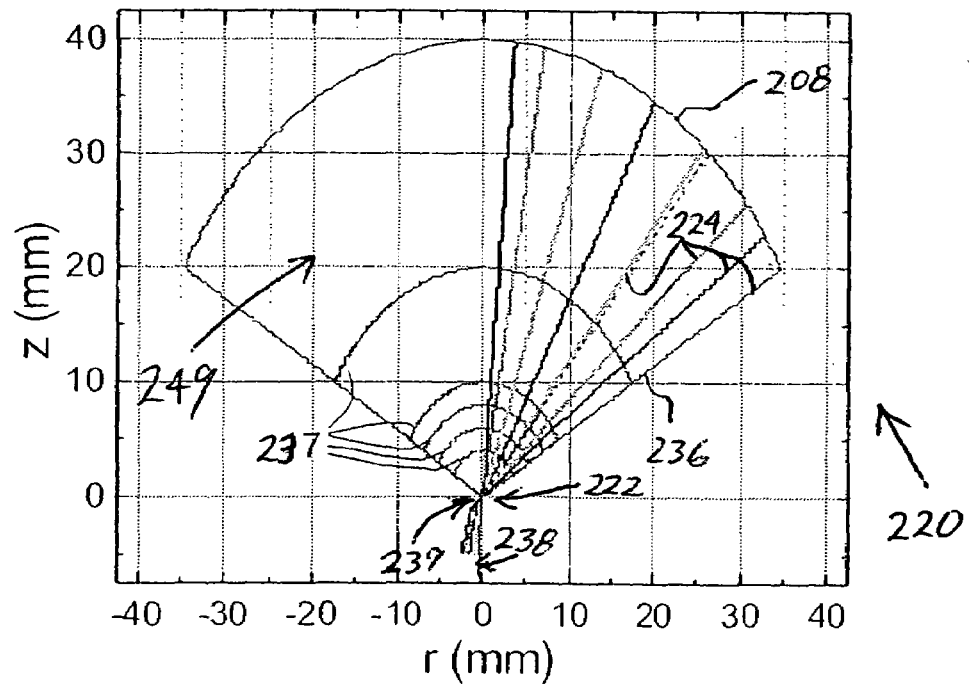
FIG. 10 is a graph showing exemplary simulated electron trajectories demonstrating a first crossover of a beamlet in an aperture of a probe beam-forming lens design.

Referring to FIG. 10, a graph 220 shows alternate simulation results for an alternate embodiment of optical column employing the hemispherical electron source 113 and hemispherical wire mesh electrode 114 of FIG. 6, where each of the source and electrode are approximately 8 cm in diameter. In this embodiment, the electron source 113 and optical column are operated so that (in contrast to the comparable devices shown in FIG. 9) the various beamlets 224 produced by the different radial elements 208 converge at a central crossover 222. In certain embodiments, the beamlets 224 can together form a probe beam. More particularly as shown, an illumination lens 249 is defined by an outermost conical metal electrode 236 with 120 degree apex angle with its apex on an optical axis 238. Inside the conical surface formed by the electrode 236 are positioned five additional spherical wire mesh electrodes 237, each of which has greater than or equal to 80% transparency, and which have diameters of 40, 20, 16, 12, and 8 mm, respectively. All of the spherical surfaces of the electrodes 237 and also the electron source 113 are concentric so as to share a center coinciding with an apex 239 of the cone on the optical axis 238.

Referring additionally to FIG. 11 electron trajectories through an aperture 246 at the apex 239 of the cone of FIG. 10 are shown in more detail. The aperture 246 in the present embodiment is carved out of a single metal bloc 242 to the dimensions shown. Each of the elements shown (e.g., the metal bloc and the electrodes) are electrically isolated from one other. In addition, the conical surface formed by the electrode 236 is divided into several electrically isolated sections at the plane of intersection of the cone with inner spherical shells, such that the section of the cone between any two spherical shells is electrically independent of the remaining elements.

In the embodiment of FIGS. 10 and 11, the trajectories of the electrons that represent the beamlets 224 emitted from certain of the radial elements 208 are shown in particular, namely, those beamlets associated with radial elements at angular positions θ=5, 10, 20, 30, 40, 41, 50, 55 degrees (where the semiangle θ is measured from the optical axis 238. Assuming that each of the radial elements 208 has a width of Δθ=1 degree, then the electron trajectories at 40 and 41 degrees as shown represent the physical boundary of one of the beamlets. For clarity, only electron trajectories in the right half of the optical column are shown, albeit it should be understood that similar electron trajectories could exist in the left half of the optical column as well.

In certain embodiments of the system shown in FIGS. 10 and 11, the beamlets 224 can be formed by the turning on of one or more of the radial elements 208 that are sufficient to generate a beamlet that is a circle 244 with a finite width 248 as shown in FIG. 12A (which shows a particular horizontal cross-section of the beamlet at a given z value along the optical axis 238), before the beamlet is focused to form a narrow beam along the optical axis (for the duration of the pulse on a radial element). For the radial element pattern 9 shown in FIG. 5, the beamlet of FIG. 12A would be formed from the switching on of four quarter radial elements/sections, each with $\delta\phi \approx 90$ degrees.

In FIGS. 10 and 11, the initial energy of the electrons is 5 eV (e.g., the energy of the electrons at the wire mesh electrode 114 in front of the electron source 113 as discussed with respect to FIG. 6) for all of the radial elements 208. In this particular simulation, the voltages on all electrodes outside the innermost (8 mm diameter) shell are held constant irrespective of the radial element pulsed at a given time. Potentials on these electrodes (ranging from 5 to 15 V) are chosen such that all the beamlets 224 follow near straight line paths towards the center. To obtain the first crossover point of the beamlets 224 in the aperture 246, the voltage on the aperture 246 (e.g., the voltage on the metal bloc 242) is held constant at 20 V (for all beamlets) and the section of the conical electrode 236 below the 8 mm diameter shell formed by the wire mesh electrode 237 is fine tuned for each beamlet in the 10-15 V range. Thus, by adjusting the potential on the single electrode 237, the desired crossover is achieved. With proper scaling of the potentials on all of the electrodes 237, such a fine control on the beamlets 224 can be achieved for larger sources as well as for different initial energies of the electrons.

An additional characteristic of the embodiment shown in FIGS. 10-11 is that the illumination lens 249 formed by the electrode 236 is non-dispersive, such that all (or nearly all) of the electrons emitted from a given one of the radial element 208 with their energies in the range of ±1 eV converge at the central crossover 222 without lateral dispersion. Considering that the initial energy spread of the electrons is less than 0.1 eV, the absence of dispersion results in an ability to achieve a very high quality shaped beam by increasing the accelerating potentials in the illumination lens 249 and the aperture 246. It should be noted that stochastic interactions are ignored in these calculations, but with careful choice of the aperture potential, radius of the beam crossover region, and the beam current required, an interaction negligible regime can be easily obtained.

FIG. 12B provides a schematic cross-sectional view of one embodiment of an overall probe beam device that utilizes the illumination lens 249 shown in FIGS. 10 and 11. As shown, the probe beam device 250 includes not only the illumination lens 249 having the aperture 246, but also includes a pair of electrostatic lenses 252 and a magnetostatic or magnetic condenser lens 253. As shown, after the central crossover 222 occurs at the aperture 246, the beamlets (now labeled as beamlets 251) are focused once again onto the optical axis 238, but this time by way of the electrostatic and magnetostatic lenses 252 and 253 the beamlets are collimated as well.

In contrast to the continuous electron beams provided by conventional field emission point sources, the final beam 258 in the present embodiment is constructed from the multiple beamlets 251 spanning different radial distances from the optical axis 238 (before they reach aperture 259). The beamlets 251 can be appropriately assembled to form the overall final beam 258 by way of well-programmed time-sequencing of the beamlets (e.g., the appropriate timing of the turning on and off of the radial elements creating those beamlets), and the fine tuning of the electrodes (e.g., the electrodes 236, 237 of the illumination lens 249) at speeds of less than 1 µs based on the pre-calibrated look up tables. The net result is less wastage of the available beam current, superior beam quality, and beam control over 1-10 ms intervals (e.g., the duration of each beamlet). In alternate embodiments, the magnetic condenser lens 253 can also be modified to have a primary coil and a secondary coil, where the current in the smaller secondary coil is modulated to suit different beamlets for superior performance.

Referring to FIGS. 13A-13D, additional simulation results for an 8 cm diameter hemispherical electron source 313 in combination with four different embodiments of illumination lenses 296-299 positioned above a level of a mask 322 are shown, respectively. The different illumination lenses 296-299 of FIGS. 13A-13D are each formed by different respective combinations of wire mesh electrodes 314, 302, 303 and 304, a conical electrode 316 and additional cylindrical electrodes 306, 307, 308, 309, 310, 311 and 312. Each of the different illumination lenses 296-299 is one exemplary embodiment of illumination lens that can be used in an optical column such as the optical column 60 of FIG. 6, particularly for the purpose of serving as a wide-field, full chip exposure tool.

FIGS. 13A-13D further show how the path of an exemplary beamlet 338 emitted by the electron source 313 can be controlled/directed within the illumination lenses 296-299 by way of the various electrodes. The beamlet 338 shown in each of FIGS. 13A-13D is formed by a $\Delta\theta = 1$ degree radial element 339 between $\theta = 59$ degrees and 60 degrees ($\theta$ is measured from an optical axis 337). Further as shown, the beamlet 338 in each case is focused on the mask 322 placed at the base of the respective illumination lenses 296-299. For clarity, only beamlet trajectories to the right of the optical axis 337 are shown, and beamlet 338 in each of the FIGS. 13A-13D can resemble the ring-shaped beamlet circle 244 of FIG. 12.

In each of FIGS. 13A-13D, the illumination lenses 296-299 are defined by the conical electrode 316 and three cylindrical electrodes 306, 307 and 308. The conical electrode 316 with an apex angle of 120 degrees is truncated where it intersects with one of the wire mesh electrodes 302, which is spherical and has a diameter equaling 6 cm in the present embodiments. Below the junction of the wire mesh electrode 302 and the conical electrode 316 are the three cylindrical electrodes 306, 307 and 308, which are stacked one above the other such that the top electrode in the stack is the electrode 306 and the bottom electrode is the electrode 308. Each of the cylindrical electrodes 306, 307 and 308 is a few cm long (e.g., 1 to 3 cm in height) and 6 cm in diameter.

Figure 13B:
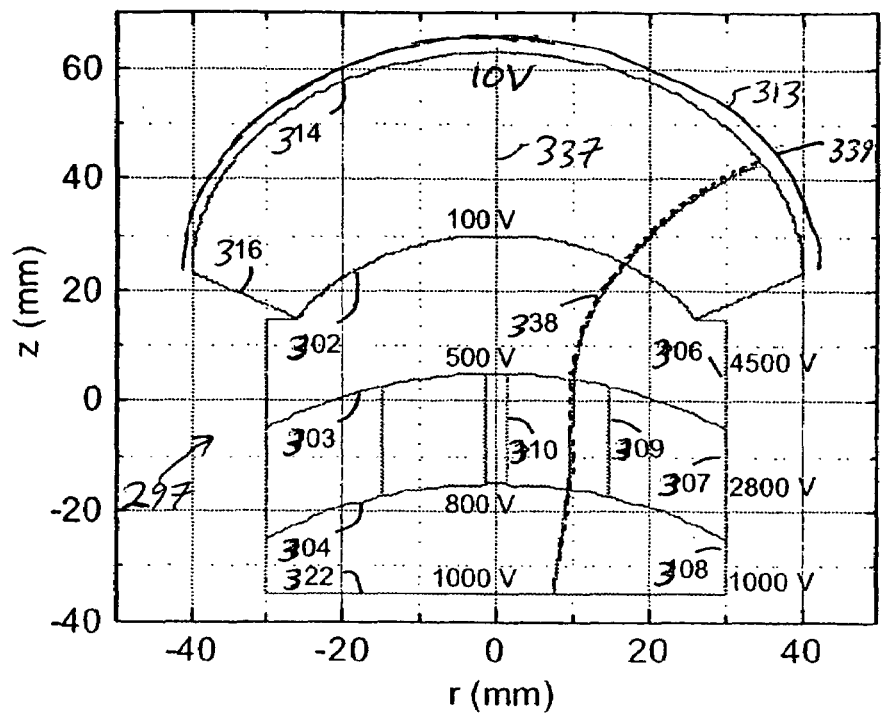

The illumination lenses 296 and 297 of FIGS. 13A and 13B each have, in addition to the wire mesh electrode 302, two additional spherical wire mesh electrodes 303 and 304, each of which has a diameter of 6 cm in the present embodiments. The electrodes 303 and 304 are respectively positioned so as to intersect the junction between the cylindrical electrodes 306 and 307 and the junction between the electrodes 307 and 308, at approximately 3 and 1 cm respectively from the base of the illumination lenses at which the mask 322 is placed. Thus, in these embodiments, the cylindrical portions of the illumination lenses 296 and 297 are divided into three electrically-isolated regions, namely, a first region defined by electrodes 302, 303, and 306, a second region defined by electrodes 303, 304 and 307, and a third region defined by electrodes 304, 308 and the mask 322. The potentials on the electrodes 314, 302, 303, and 304, as well as on the mask 322, remain the same for all beamlets (e.g., for all θ). For purposes of the simulations, the initial energy of the electrons at the electrode 314 is assumed arbitrarily to be 3.5 eV for all trajectories, with dispersion in energy at less than 0.1 eV.

Figure 13C:
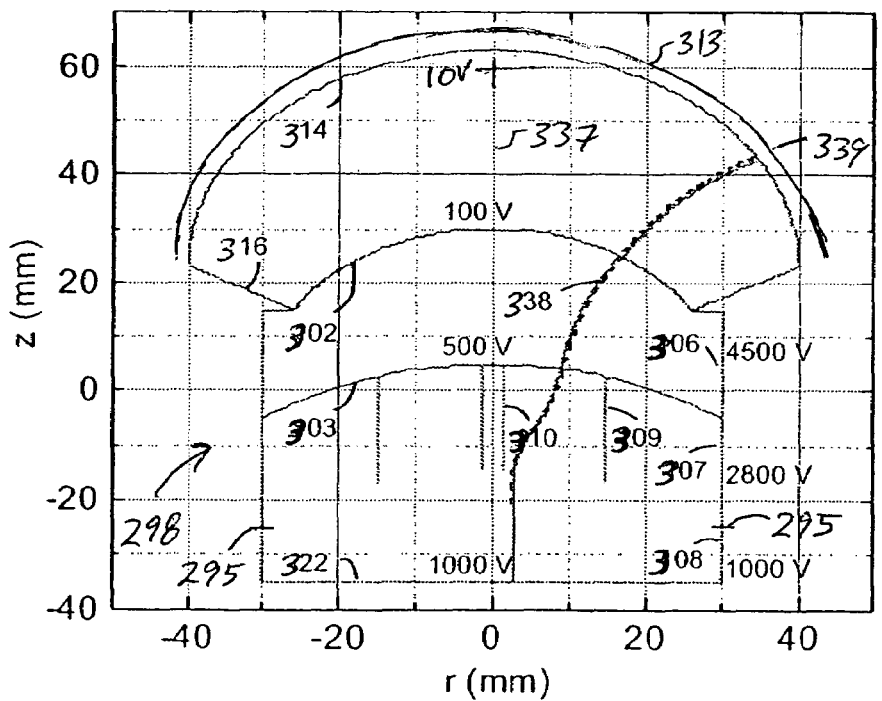
Figure 13D:
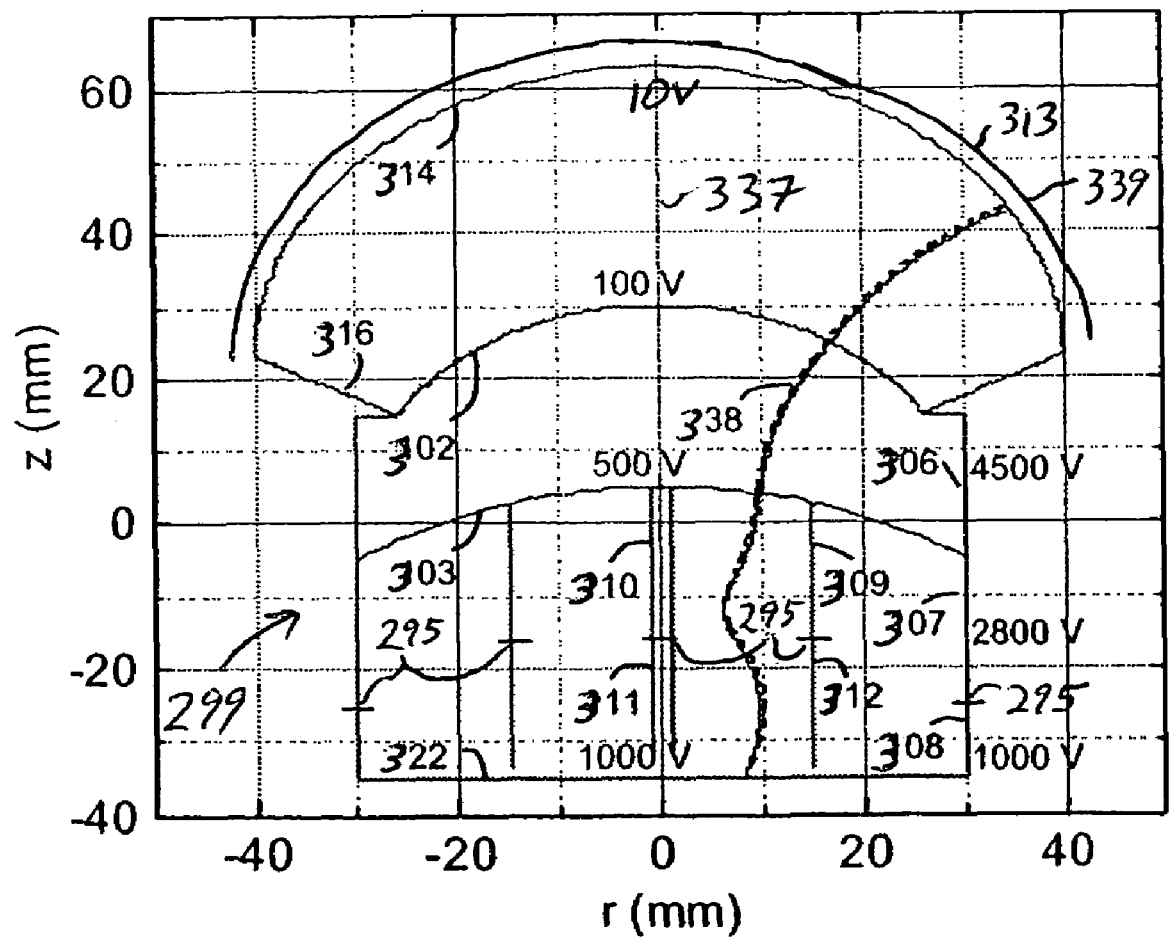

In contrast to the illumination lens 296 of FIG. 13A, the illumination lens 297 of FIG. 13B also includes the two electrodes 309 and 310, which have arbitrarily thin walls and are cylindrical in shape, with diameters of 3 cm and 1 mm, respectively. As shown, the electrodes 309, 310 in particular are positioned between the electrodes 303 and 304. As for the illumination lenses 298 and 299 of FIGS. 13C and 13D, respectively, the lens 298 of FIG. 13C is identical to that of FIG. 13B (including electrodes 309,310) except insofar as the lens does not include the spherical electrode 304. Additionally, the electrode configuration of the illumination lens 299 of FIG. 13D is identical to that of FIG. 13C except insofar as two additional cylindrical electrodes 311 and 312 (with the same diameters as the electrodes 309 and 310). More specifically, the cylindrical electrodes 311 and 312 are positioned between the cylindrical electrodes 310 and 309, respectively, and the mask 322, with the boundary between the electrodes 311, 312 and electrodes 310, 309 generally following the boundary that would have been formed by the spherical electrode 304 shown in FIGS. 13A-13B (even though the electrode 304 is absent). As indicated by cross-hatches 295 shown in FIGS. 13C and 13D, the electrodes 308, 311 and 312 are electrically isolated from the neighboring electrodes 307, 310 and 309, respectively.

As noted above, the illumination lenses 296-299 can be implemented as part of different embodiments of optical columns such as the optical column 60 of FIG. 6. Consequently, the simulation results provided in FIGS. 13A-13D serve to demonstrate that wide-field electron optical devices such as the optical column 60 of FIG. 6 are capable of exercising sufficient control over the direction and size (focus) of the beamlets. More particularly, FIGS. 13A-13D illustrate that optical devices such as the optical column 60 have the ability to focus (or collimate if necessary) the beamlets 338 to arbitrary values of r, Δr values at the level of the mask 322 level and additionally at the level of the wafer (e.g., the wafer 28 shown in FIG. 6), where r is the radius of the beamlet on the mask (or wafer) and Δr is the width of the beamlet (e.g., the beamlet 244 of FIG. 12).

Although not shown in FIGS. 13A-13D, further simulations show that, by varying the potentials on all of the electrodes in specific combinations, r, Δr values can be varied over a wide range (e.g., over a few cm for r and over several μm to mm for Δr) for each beamlet, irrespective of the injection angle θ. Introduction of additional electrodes as described in FIG. 6 and FIGS. 13A-13D (or the use of differently-positioned electrodes or further electrodes other than those shown) ensures that the entire mask is either uniformly illuminated or gets programmed dosage(s), often with multiple radial elements covering the same area on the mask. The effect of the variation in emission characteristics of the individual radial elements can also be corrected by a careful calibration procedure discussed earlier using pixellized MCP detector. It can further be observed that, if the radial separation between various cylindrical and conical electrodes (e.g., the electrodes 115, 118 and 123 of FIG. 6) is less than 1.5 cm, the voltages applied on those electrodes to control the beamlets will be less than ±500 V even in the projection lens of the optical column where the beam voltage is greater than 5 kV. Hence, these simulation results demonstrate that optical columns such as the generalized optical column 60 of FIG. 6, with proper choice of electrodes and voltage lookup tables obtained for all injection angles, can serve as a truly wide-field, apertureless, full-chip projection system.

FIGS. 13A-13D also illustrate that a given beamlet can be controlled both in terms of its position in r, and in its beamlet width Δr, as well as to have multiple crossovers during the course of its path through the optical column given appropriate control with sufficient electrodes. It should be noted that a crossover need not involve the passing of all electrons of the beamlet through a single point, but rather can be a noninfinitesimal region such as the 45 micrometer-wide region shown in FIG. 9. Typically each successive crossover in a set of multiple crossovers occupies less space than the previous one. It should also be noted that each of the beamlets 338 shown in FIGS. 13A-13D are displayed as the combination of a dashed line and a solid line, with the space between those lines representing the width of the beam at any given point along its path. Where the dashed and solid lines cross one another, a crossover of the beamlet has occurred.

Figures 14A, 14B:
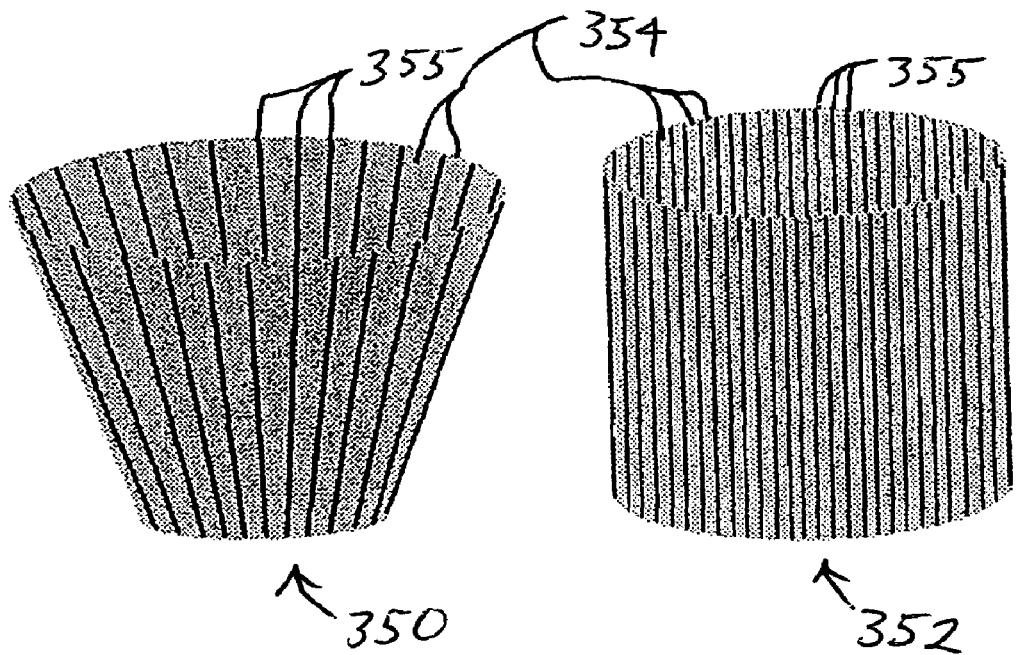
FIGS. 14A-14C are schematics of electrostatic conical and cylindrical lens elements that can be employed in certain embodiments of the projection lithography tool of FIG. 6, and which allow for controlled rotation of electron trajectories around an optical axis.

Referring to FIGS. 14A and 14B, exemplary designs of conical and cylindrical electrodes/lens elements 350 and 352 are shown, respectively, which can be employed as several of the electrodes discussed above (for example, the electrodes 115, 116, 118, 119, 123, 124, 125, 126 of FIG. 6, as well as the electrodes 306, 307, 308, 309, 310, 311, 312 and 316 of FIGS. 13A-13D). The conical and cylindrical electrodes 350 and 352 are capable of providing rotation of beamlets such as the beamlets 338 of FIGS. 13A-13D around the optical axis (e.g., the optical axis 337) by way of electrostatic fields. In particular, as shown, the surface of each of the electrodes 350,352 is divided into several (e.g., N) sub-elements 354 (that can also be referred to as "lens strips" or "φ-elements") that are electrically isolated from one another by way of gaps or insulating material 355. Each of the sub-elements 354 extends along the length of its respective electrode, that is, extends in a substantially linear manner along a direction that is either parallel to the central axis of the electrode or within a plane that includes that central axis (where the central axis of the electrode typically would coincide with the optical axis, such as the optical axis 337).

Figure 14C:
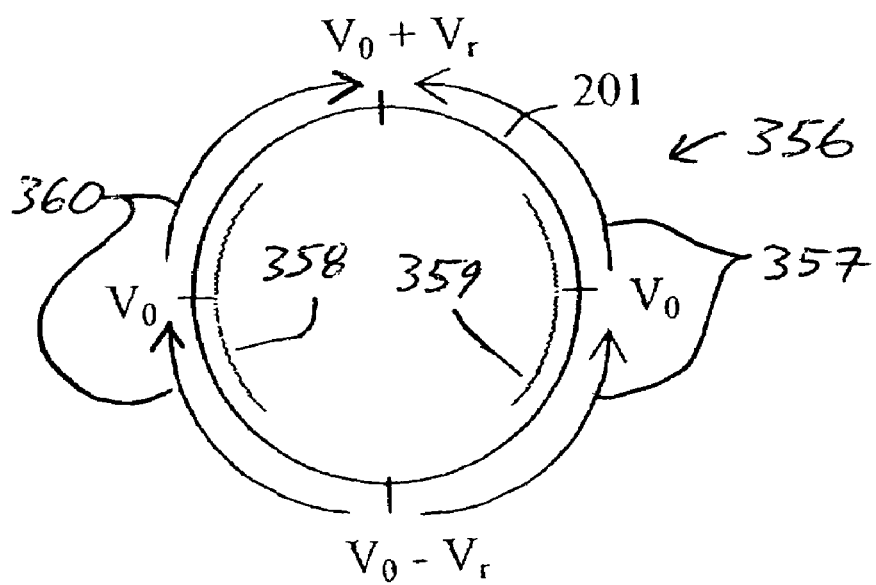

Referring additionally to FIG. 14C, a schematic 356 illustrates how the electrodes 350,352 shown in FIGS. 14A and 14B affect beamlets. In particular, the schematic 356 shows how voltages could vary around a cross-section of one of the electrodes 350,352, for example, between a high voltage $V_0+V_r$ and a low voltage $V_0-V_r$. Given such variation in the voltage around the electrode, left and right beamlets 358 and 359, respectively, would tend to rotate as shown by arrows 360 and 357 corresponding to those beamlets, respectively. That is, given such variation in the voltage, the left beamlet 358 would tend to rotate in a clockwise manner, while the right beamlet 359 would tend to rotate in a counter-clockwise manner. In certain embodiments, and as shown in FIG. 14C, to avoid or minimize edge effects, only two opposite radial elements (δφ=90 degree arcs on the source) would be pulsed simultaneously.

Thus, through the use of conical/cylindrical electrodes such as those shown in FIGS. 14A and 14B, in combination with the application of appropriate varying voltages to the sub-elements or lens strips of those electrodes, it is possible to achieve rotational variation of beamlets in addition to variation in the radial positioning and size of the beamlets as discussed with reference to FIGS. 13A-13D. The rotational effects upon the beamlets caused by the electrodes 350,352 in accordance with FIG. 14C can be explained as follows. If the voltages on the sub-elements 354 in each quadrant vary from $V_0$ to $V_0 \pm V_r$ as shown, the potential difference between adjacent sub-elements is $4V_r/N$, and so the electric fields within the interior of the electrode will have a component $E_\phi$ along with $E_r$, $E_z$ components (in cylindrical coordinates). As a consequence the electron trajectories within the beamlets flowing through the electrodes 350,352 rotate.

At the same time, the electrons within the beamlets also experience torques, along with the rotation, and consequently there is potentially unwanted magnification and distortion of the beamlets from their initial circular or arc-shaped cross-sections. To counter these effects, the lens space between the electron source (e.g., the source 113 of FIG. 6) and the mask (e.g., the mask 122 of FIG. 6) is divided into several horizontal sections along the optical axis and the polarity of $V_r$ is reversed in adjacent sections such that the beamlet experiences opposite torques as it moves down the optical column. The overall effect is that the beamlet undergoes net rotation but gains no angular velocity (about the optical axis) as it nears the mask (or wafer) plane. Depending upon the choice of the length and number of sub-elements (N) within each of the conical and cylindrical electrodes 350, 352, as well as the choice of $V_0$ and $V_r$ for each electrode, the circular cross section of the beam can be maintained (e.g., as shown in FIG. 12A) with no angular velocity at the mask level (e.g., no magnification due to angular motion), while achieving beamlet rotation up to several degrees.

Figure 15A:
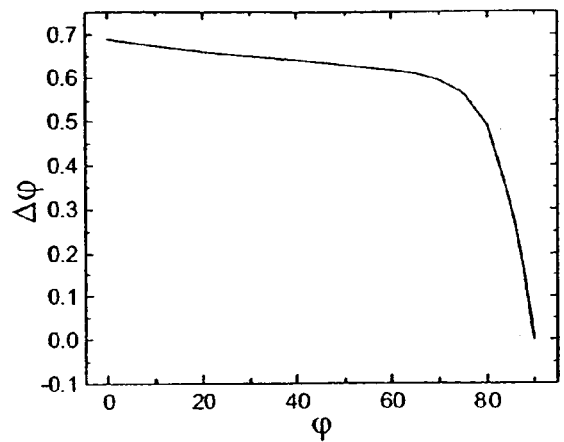
FIGS. 15A and 15B are graphs showing exemplary simulation results for angular rotation about an optical axis using lens designs such as those discussed with reference to FIGS. 14A-14C, and FIGS. 15C and 15D are respective schematic representations of the voltage configurations used to obtain the simulation results of FIGS. 15A and 15B, respectively.

FIGS. 15A and B show exemplary 3D simulation results that indicate how a beamlet's shape and intensity can be varied by way of different voltages being applied to the various sub-elements 354 of the conical/cylindrical electrodes 350, 352 discussed with reference to FIGS. 14A-14C. The simulation results correspond to the behavior of such sub-elements being implemented on the optical column shown in FIG. 10 as part of the conical electrode 236, between the radial elements 208 of the electron source and a 40 mm diameter wire mesh electrode 237. Although the simulation results were obtained assuming an optical column of the type shown in FIG. 10, the results are intended to indicate that similar control over beamlet shape and intensity can be achieved in any of a variety of different types of optical columns taking the form shown in FIG. 6 and other forms, by appropriately controlling the voltages applied to sub-elements/lens strips of conical or cylindrical electrodes as discussed with reference to FIGS. 14A-14C.

Figure 15B:
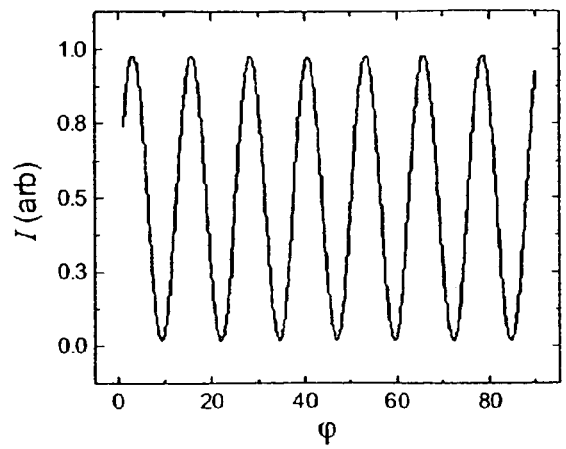
Figure 15C:
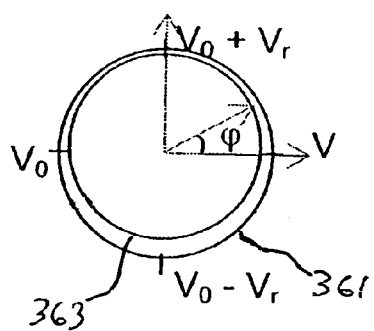

More particularly, the conical electrode 236 is divided into N=180 sub-elements 354. Assuming that a voltage differential is applied across the sub-elements 354 as shown in FIG. 15C, such that the voltage varies across the conical electrode 236 from $V_0$ to $V_0 \pm V_r$ (e.g., where $V_0$=10 V and $V_r$=0.5 V), the potential difference between adjacent electrodes is then $V_r/N$. Given this voltage distribution, the net change in $\phi$ within the lens space (e.g., the rotation of the trajectories of the different electrons within the beamlet, $\Delta\phi$) as a function of initial angular position $\phi$ are plotted in FIG. 15A for $\theta$=50 degrees (where $\theta$ is the angular distance of the beamlet measured with respect to the central optical axis as discussed above). The plot in FIG. 15A shows that for values of $\phi$ greater than 45 degrees, the rotation angle $\Delta\phi$ drops off rapidly, but for values of $\phi$ between −45 and 45 degrees the rotation angle is approximately linear in $\phi$. Although not shown in FIG. 15A, it will be understood that, as $\theta$ decreases, $V_r$ will be increased to obtain the same rotation but the functional form remains the same.

It should be noted that $\Delta\phi$ represents the rotation of the beamlet achieved within the conical lens interior space, while $\delta\phi$ represents the span of the radial element that produced the beamlet. For a radial element that spanned values of $\phi$ between −45 degrees and 45 degrees (e.g., $\delta\phi$=90 degrees), if the polarity of $V_r$ was reversed for other lens elements down the optical column, the small linear dependence of $\Delta\phi$ on $\phi$ could be corrected along with the elimination of net angular momentum gained by the beamlet. The net result would be pure rotation of the beamlet about the optical axis. Thus, in this type of lens with its horizontal cross-section 361, a beamlet 363 as shown in FIG. 15C would be distorted from its initial circular cross section (e.g., as shown in FIG. 12A as circle 244) to an elliptical cross-section 363. Although such a distortion could be eliminated along with the nulling of net angular momentum described earlier, the presence of this distortion would not affect the overall ability of the optical column to uniformly illuminate the mask 122. The results of FIGS. 15A and 15C are easily generalized for application in electrodes operating at higher voltages (for example, the electrodes discussed with reference to FIGS. 13A-13D), where $V_r$ would be a fraction of $V_0$ but resulting in larger $\Delta\phi$.

As discussed above with respect to FIG. 6 and others of the figures (e.g., FIGS. 13A-D), the present invention in at least some embodiments is capable of wide-field optics operation. In particular, through the use of appropriate electron sources and various optical columns and related electrodes, it is possible in at least some embodiments manipulate beamlets (and beams) in a variety of manners including magnification/de-magnification of the beamlets, producing of crossovers in the beamlets, changing/moving the paths of the beamlets, and rotating the beamlets, for example as discussed with reference to FIGS. 13A-D and 14A-C. Thus, it becomes possible to provide optical columns such as the optical column 60 of FIG. 6 that are capable of uniformly illuminating masks such as the mask 122 of FIG. 6, demagnifying (or magnifying) images on wafers such as the wafer 128 of FIG. 6, producing crossovers of beamlets that are to impinge such masks and wafers, as well as moving and rotating the beamlets in appropriate manners for impinging such masks and wafers.

Yet, in still additional embodiments of the present invention, it also is possible to perform maskless lithography ("ML2") using a same or similar tool employing an electron source and optical column with electrode(s) as discussed above. In particular, it is possible to develop pixels from beamlets by splitting any given beamlet (e.g., such as the beamlets 338 shown in FIGS. 13A-13D) having an arbitrary cross-section into several pixel-beamlets, where each of the pixel-beamlets has a "programmable" length in the $\hat{\phi}$ direction but has a width (in r) equal to that of the beamlet at the wafer. The beamlet could begin, for example, with a circular cross-section such as that shown in FIG. 12A or a portion of a circular cross-section (e.g., corresponding to one or more radial elements with $\delta\phi$ less than 90 degrees), and then be modified into the form of one or more pixel-beamlets having a length less than a degree in $\hat{\phi}$ direction but a width equaling the width of the original beamlet. Upon generating such pixel-beamlets, it then becomes possible to construct the required circuit pattern from these pixel-beamlets.

Figure 15D:
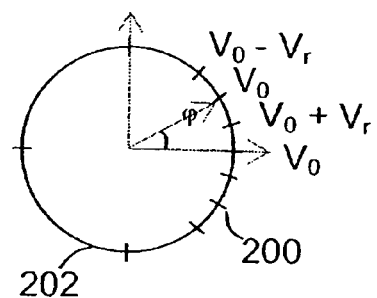

Returning to FIG. 15A, as shown, for values of $\phi$ between −45 degrees and 45 degrees, $\Delta\phi$ is linear in $\phi$. However, for values of $\phi$ above 70 degrees, $\Delta\phi$ decreases sharply with $\phi$ while vanishing at $\phi$=90 degrees. This behavior results in bunching of electron trajectories at $\phi$=90 degrees, assuming that other electrodes/lenses were also set accordingly. However, if alternatively the potentials on the sub-elements of the conical/cylindrical electrodes are set differently, for example as shown in FIG. 15D, electron density (e.g., intensity in arbitrary units) variations plotted in FIG. 15B result within the beamlet. Such electronically controllable density variations within each beamlet serve as pixel-beamlets for ML2. That is, the differential rotation imparted to spatially separated electron trajectories result in multiple crossovers in $\hat{\phi}$ as well as $\hat{r}$ directions within the beamlet, and these crossover points can effectively be used in forming pixel-beamlets with proper choice of potentials on all lens elements.

The spatial distance between the pixel-beamlets (near the wafer) cannot be reduced to arbitrarily low values due to the upper limit on the maximum periodicity achievable in the electron density (I) by increasing N alone. However, the total fluence of the beamlet is distributed into m arbitrarily placed pixel-beamlets where m is less than M, the maximum number of pixel-beamlets achievable per beamlet. M depends on the position of the radial element, as well as the distance between the beamlet and walls of the electrodes in the optical column.

For a CD of less than 10 nm on the wafer, the distance between pixels formed by the pixel-beamlets should be less than 10 nm as well. In one embodiment, this is accomplished electronically as follows. Instead of varying the voltages applied to the sub-elements/lens strips of a given conical/cylindrical electrode as shown in FIG. 15D (e.g., simply as a sequence of values $V_0$, $V_0+V_r$, $V_0$, $V_0-V_r$, $V_0$), a variety of other sequences of voltages (e.g., $V_0$, $V_0+V_s$, $V_0$, $V_0-V_t$, $V_0$) could instead be applied to the various sub-elements/lens strips. By using one or more of such myriad combinations, it is possible to change the potential well spacings by arbitrarily small values from one another. In addition, these potential changes on the sub-elements/lens strips can be accomplished in less than 1 ns (e.g., the rise time of the signal), while the potentials last for 10 ns to 10 μs, so that within 1-10 ms duration of the beamlet, several hundreds to thousands of pixels of different dosages, lengths, and spacings can be written on a wafer.

Programmable dosage resulting from easy controllability of emission from the diode structures/electron sources discussed above, as well as from easy controllability of the durations of pixel beamlets, can be used for grey scaling. The above description (particularly in relation to FIGS. 6 and 12) shows that a beamlet incidence coordinate on a wafer (r) depends strongly on the potentials (e.g., $V_0$) of conical and cylindrical electrodes/lens elements, particularly those of the illumination lens above the mask, while the beamlet width ($\Delta r$) depends on the high voltages spherical/planar electrodes, particularly those within the projection lens section between the mask and the wafer. The low voltages applied on the illumination lens electrodes (e.g., $V_0$ less than ±500 V) are changed by small values (e.g., less than 10 V) with less than 1 ns rise times and 1-10 μs duration times while not affecting the projection lens settings. Thus, by rapidly changing the low voltages $V_0$, $V_r$, $V_s$, $V_t$, etc., the above pixel-beamlets are translated in r as well.

When different radial elements are switched on, the risetimes of the potentials on the various electrodes is also expected to be less than 1 μs (with the pulse lasting for about 1-10 ms), because this involves changing potentials in the projection lens as well. For controlling the pixel-beamlets, the change in potentials is much smaller and rise times of less than 1 ns are achieved. The duration Of these pulses is programmed to be 10 ns-10 μs. Thus, by sweeping the beamlet by a distance greater than 100 μm in r at the wafer, without affecting the width of the beamlet in the focal plane (e.g., the wafer) during such translation, the stochastic interactions are eliminated between the electrons as the number density will be low similar to the situation in projection lithography discussed earlier. In the case of projection systems too, by incorporating ϕ-elements, complete coverage of the mask is accomplished by translating and rotating the beamlets by distances greater than 1 mm on the mask plane while not affecting the width of the beamlet in the focal plane.

During the time taken for the lens potentials to switch from one programmed pixel configuration to another, the continuous electron flux in the beamlet results in relatively uncontrolled exposure of the wafer. Under high fluence conditions, this uncontrolled exposure can become more pronounced unless the ratio $t_r/t_p$, where $t_r$ is the rise time and $t_p$ is the pulse duration, is kept as low as possible for all pulses. For typical fluence conditions obtained from a diode structure/electron source such as that of FIG. 2, the unprogrammed fluence in 1 ns will only be $10^{-5}$ times the dosage required for a resist with 5 μC/cm² sensitivity (assuming that during the time $t_r$ the fluence is uniformly distributed throughout the exposure area). Considering that several passes are required to expose all of the pixels in the above arc, $t_r$ values of less than 1 ns are desirable for process reliability. For beamlets generated from large area sources (for example, a 400 mm diameter hemispherical shell such as that discussed with respect to FIG. 4 having an emission current of 40 nA/cm²), for approximately 100 pixel beamlets/beamlet (each having an area of 10 nm×10 nm at the wafer), each pixel duration should be approximately 4 ns. Thus, to achieve maximum throughput at a CD less than 10 nm, rf (radio frequency) lens designs are appropriate, where the voltages on sub-elements/lens strips of a particular electrode/lens section are changed at frequencies of less than or equal to about 1 GHz.

For example, the wire mesh electrodes 117, 120, 121, and mask 122 in FIG. 6 set the physical boundaries along the optical column for different regions. All sub-elements/lens strips (e.g., those associated with the conical electrode 116 or 115) in a given region are pulsed at the same frequency. However, down the optical column from the electron source to the mask level, this frequency is gradually increased from one region to the next. Thus, high throughput is achieved with relatively few sub-elements/lens strips operating at less than or equal to 1 GHz. When the sub-elements/lens strips are pulsed at high frequencies, the distance between the beamlet and the lens walls should be minimized to avoid the adverse effects of propagation delay of signals in the fiber optical signal lines as well as in the lens space itself. Although each sub-element is physically large, the estimated capacitance is less than 1 pF/element and the length of the sub-element (e.g., less than 2 cm) is short, compared to the wavelength of the signal. Inductance of the leads can be minimized by keeping various switches and adder circuits close to the lenses, while operating them via fiber optic network. Here, the main difference from a digital network is the requirement of standardized analog levels. By careful choice of the programmed sequence of pixels, and multiplexing all sub-elements with the same potential at a given time, the number of bits/sub-element placed close to the lens are optimized. In addition, to reduce the cluttering of lens walls, only the rapidly changing least significant bits in the adder circuit plus a few error control bits will be surface mounted while the rest of the slowly varying bits are placed outside the active lens space. Error control bits are necessary for the fine alignment of wafers independently in each source/lens assembly and for synchronization of several assemblies to a common data bus. As the information content in high density circuit patterns is enormous (several TB), such a lens design would lend itself to high data transfer rates achievable with the optical networks. By utilizing the state-of-the-art optical communication techniques for data transmission and optical switching of the potentials on various lens elements, certain embodiments of the present invention would be capable of writing up to $10^8$ to $10^{10}$ pixels per second.

Figure 16:
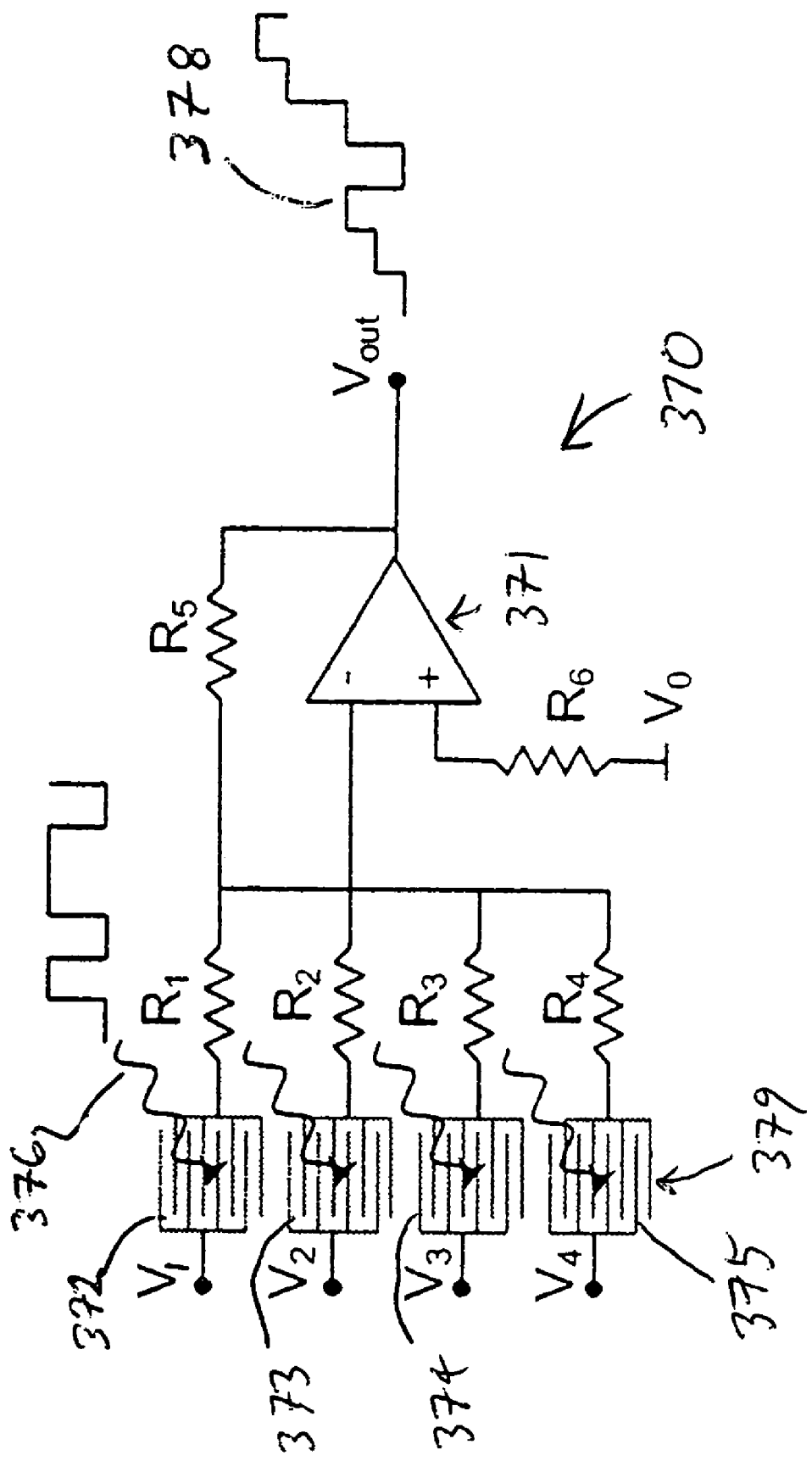
FIG. 16 is a schematic of an exemplary adder circuit based on photoconductive switches or photodiodes that can be used to generate arbitrary analog levels with less than 1 ns rise times.

FIG. 16 provides a schematic of an exemplary adder circuit 370 that can be utilized in certain embodiments of the present invention for providing arbitrary analog levels of voltages to a given sub-element/lens strip (or several of those sub-elements/lens strips) in a manner that is fast in terms of switching time (e.g., switching times of less than or equal to 1 ns). As shown, the circuit 370 includes an operational amplifier 371 having a non-inverting input coupled to a voltage $V_0$ by way of a resistor $R_6$. An inverting input of the operational amplifier 371 is coupled to each of multiple (in this case, four) resistors $R_1$-$R_4$, which in turn are coupled to multiple (in this case, four) voltage inputs $V_1$-$V_4$ by way of respective optical converters 372-375. An additional resistor $R_5$ also links the inverting input of the amplifier 371 to an output terminal $V_{out}$ that would be coupled to one (or more) of the sub-elements/lens strips and provide an effectively analog output level thereto 378.

The optical converters 372-375 can be, for example, photoconductive switches or photodiodes with integrated preamps (commercially available as optical receivers). The optical converters are triggered by intensity modulated laser radiation 376. The cw laser radiation can be modulated by a suitable low cost electro-optic (or acousto-optic) modulator(s) to carry the digital mask information. In the case of photoconductive switches, interdigitated metal lines (indicated as reference numeral 379) are fabricated on LT-GaAs (Low Temperature grown GaAs), ion implanted ($As^+$) GaAs or ($O^+$) SOS (Silicon on Sapphire) wafers. Due to the exceptionally low carrier life times ranging from 200 fs to 100 ps in these materials, GHz to THz pulses can be generated from the modulated cw laser radiation carrying the digital mask information. The circuit can also be implemented with discrete components. All of these components are fabricated on a small chip and the device (less than 1 $mm^2$ in size) can be surface mounted on the sub-elements/lens strips to eliminate the cluttering of the walls of the conical/cylindrical electrode 350, 352.

Transfer of digital mask data in ML2 to these devices via ultra thin fiber optic bundles delivering the laser radiation 376 eliminates the cross talk as well as reduces the undesired electromagnetic interference with the beamlets in the active lens space where non conductive, ultra thin fiber optic bundles take up very little volume in the path of the beamlets. As the beamlets can be rotated as well as translated about the optical axis, careful choice of the placement of these bundles in the active lens space (along with the struts which support the lens elements placed one inside the other, as discussed with reference to FIG. 6) helps negotiate the dead volume taken up by these struts and fiber optic bundles.

To reduce the number of switches (e.g., optical converters/switches 372-375) placed close to the sub-elements/lens strips and the individual voltage lines required (e.g., $V_1$-$V_4$), the most significant bits (MSB) for a given output level 378 (which may be common for several sub-elements 354) can be multiplexed as follows. In particular with respect to the embodiment of FIG. 16, if the arms with $R_1$ and $R_2$ form the least significant bits (LSB), $V_1$=$V_2$=constant. Typically these bits differ in value for the adjacent sub-elements/lens strips 354 and should be altered in shortest intervals. At any given time, only one of the arms with $R_3$ or $R_4$ will be active (e.g., for optical converters/switches 374 and 375, logical 00 and 11 states are forbidden and only 10 or 01 states are allowed) and the voltages $V_3$ and $V_4$ are changed when the respective switches are in the off position. Thus, $V_3$ and $V_4$ can be switched to a new value as well as multiplexed for several sub-elements/lens strips with their control circuitry far from the sub-elements/lens strips.

Further for example, while in one embodiment a given adder circuit such as the adder circuit 370 might be surface mounted on one of the lens strips, other such adder circuits could be positioned at other locations remote from that lens strip. Control over the inputs governing the least/less significant bits (e.g., control over the inputting of the voltages $V_1$ and $V_2$ to the adder circuit 370) could be provided by way of the switches 372,373 at the lens strip. However, control over the inputs governing the most/more significant bits (e.g., control over the inputting of the voltages $V_3$ or $V_4$ to the adder circuit 370) could be provided by way of switches at one of the remote adder circuits, the output of which would be provided as one of the voltages $V_3$ or $V_4$. As indicated above, in some embodiments, the output from the adder circuit 370 surface mounted to one of the lens strips could also be provided to others of the lens strips that required the same voltage. In these manners involving various types of multiplexing, therefore, even though the benefits of surface mounting of some of the control circuitry on certain of the lens strips could be achieved, overcrowding of circuitry on the lens strips also could be avoided.

A single modulator with dual complementary outputs can be used to drive the optical converters/switches 374,375. The propagation delay as well as the distortion in voltage level $V_3$ or $V_4$ during this far off switching does not affect $V_{out}$ 378 because the corresponding switch is turned on only after the voltage reaches a steady state value. The number of switches placed close to the sub-elements/lens strips depends critically on the propagation delay in $V_3$ and $V_4$ lines as the maximum continuous program time achievable with a given number of LSBs (for a generic mask layout) must be longer than the delay in $V_3$ and $V_4$ lines. The number of independent voltage lines required depends on the ratio of the number of sub-elements that are multiplexed to the total number of sub-elements controlling the beamlet. In addition, the amplifiers and optical receivers in FIG. 16 are powered with floating supplies (power supplies and buffer amplifiers not shown) so that these fast pulses can ride on top of the slowly varying but large potentials (e.g., $V_0$ of FIG. 15D).

Figure 17:
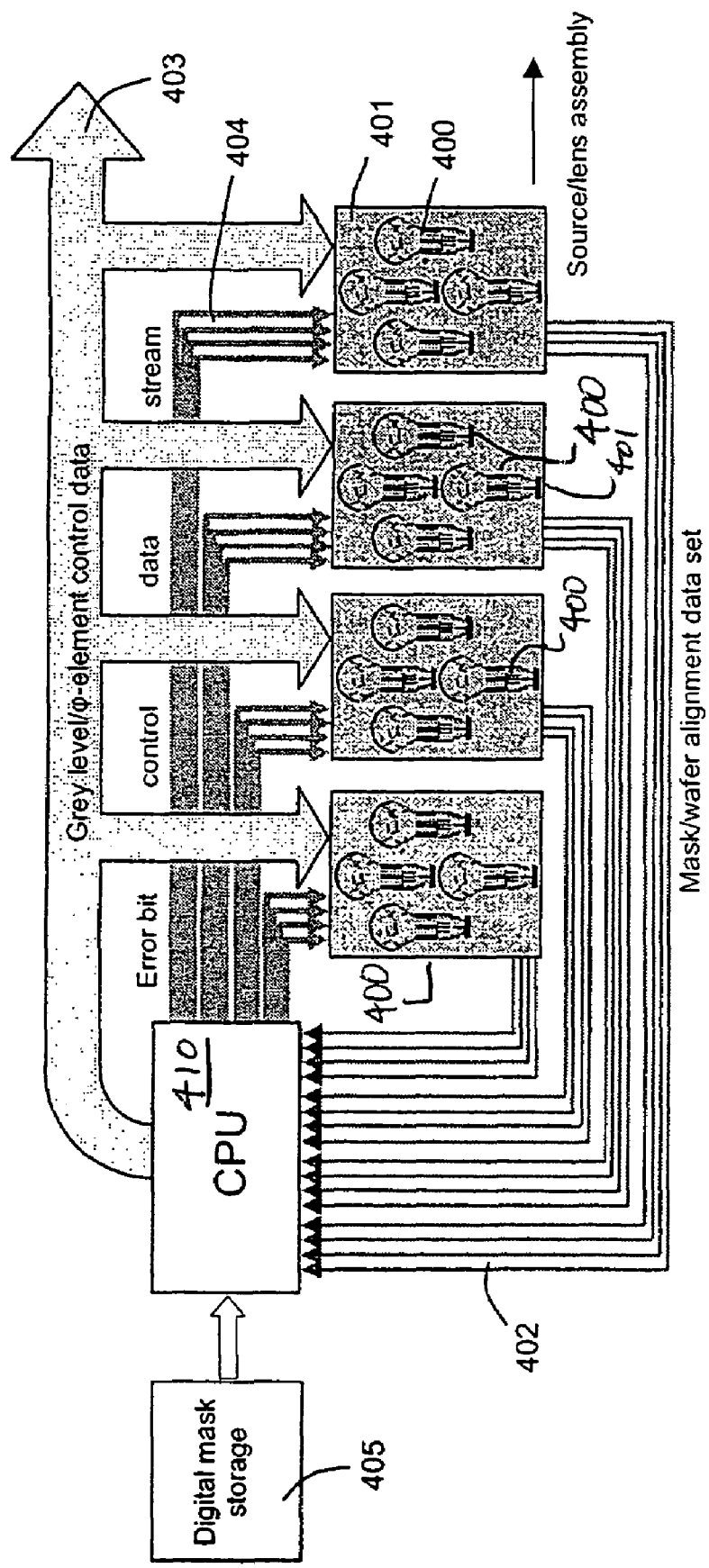
FIG. 17 is a schematic diagram illustrating a synchronization scheme for a high throughput maskless lithography platform.

Further, in some embodiments of the present invention, massively parallel maskless lithography (ML2) is also achieved by way of tool designs that are the same or similar to that discussed with respect to FIG. 6. Referring to FIG. 17 for example, several well synchronized electron source/optical column assemblies 400 of FIG. 6 that run on the same optical network are set up to increase the wafer throughput at fixed communication bandwidth, using shared memory 405, a shared computer/controller/CPU 410 and at least some shared peripheral equipment for operation of the wide-field full-chip projection/ML2 tool. In this synchronization scheme, the electron sources/optical columns 400 are arranged into clusters 401 that share some of the peripheral systems.

The dataset 402 of mask/wafer fine alignment (e.g., mechanical alignment of the mask and/or wafer) to the tool's global axes is sent to the CPU 410 from each source/lens assembly 400 before the full die exposure as the rudimentary wafer stage performs only the coarse alignment. The preprocessed and optimized digital mask information is broken into packets and each packet is processed further based on the alignment and calibration data from each electron source/optical column assembly. The packets are then sent to the clusters as two separate data streams 403, 404 as shown in FIG. 17. The larger component data stream 403, consisting of grey level (e.g., intensity)/sub-element (e.g., rotation) control data is common to all of the clusters 401. As the fine alignment and calibration data set are specific to each electron source/optical column assembly, a smaller portion data stream 404 of the above packets is unique to each electron source/optical column assembly. This smaller data stream 404 controls the error bits mentioned earlier. With the estimated wafer throughput per source/lens assembly of approximately 3 wafers (of 300 mm diameter)/hr mentioned earlier, synchronizing 25 to 30 assemblies delivers greater than 50 wafers/hr throughput.

Although some of the above discussion relates to systems that perform lithography either by way of full-chip projection/illumination through the use of masks, or by way of maskless lithography, the present invention also encompasses embodiments that are capable of performing both mask-based and maskless lithography using a single system/tool, that is, using a single combination of diode structure/electron source and optical column. Such a device could be particularly effective and efficient in mass producing chips, as follows. A first step in the manufacturing of a chip would involve mask-based lithography. Standardized portions of a chip could be formed by fully illuminating a mask with standardized attributes, perhaps for example a mask selected from a library of masks. Once the lithography of the standardized portions of the chip was completed, the mask would be removed and then remaining (typically, non-standard) portions of the chip would be created by way of the maskless lithography process described above. For some ASIC applications, for example, a library of standard mask sets can be setup for projection exposure followed by a maskless exposure of the resist within the same exposure session. Such a combination will significantly reduce the mask complexity, bandwidth and data storage overhead, and cost while improving the process reliability.

Although appropriate for lithography of chips (both involving masks and by way of maskless lithography), various embodiments of the present invention have many other possible applications. For example, embodiment of the present invention such as the probe forming lens design discussed with reference to FIGS. 10, 11 and 12A-12B can be used for various forms of microscopy including scanning electron microscopy (SEM), environmental SEM, electron microprobe analysers (EMPA), low energy electron microscopy/diffraction (e.g., LEEM/LEED), high quality BWO (Backward Wave Oscillators), as well as in subnanometer alignment optics for the ML2 tool. The probe beam can also be used in existing direct write electron beam lithography systems. With exceptional beam quality and higher (usable) beam currents of greater than 1 μA for direct writing purposes, embodiments of the present invention can outperform the conventional devices.

In the case of SEM, TEM, as well as LEEM/LEED, only small beam currents up to 100 pA are required to image the sample surface but in EMPA, up to 200 nA, high energy beam (~20 kV) is focused on to an area 2-6 μm in diameter. The resulting backscattered electrons, secondary electrons, as well as X-ray spectrum are analyzed to obtain microscopic information of the elemental abundance, atomic density etc. Large currents in comparison to SEM are required in this application to generate more X-rays and improve detection limits as well as accuracy of the spectrum. This detailed information is routinely employed in fields as diverse as geology, gemology, archeology, forensics, physics, chemistry, electronics, materials science, metallurgy, environmental science and engineering, biology, medicine, and dentistry. Embodiments of the present invention are advantageous particularly insofar as they do not require a high vacuum for their operation, there is a low spread in electron energies (e.g., largely monoenergetic electrons), and beam control can be performed with relatively smaller voltage potentials being applied to the electrodes, as well as with the use of an electron source that is relatively low in its energy requirements.

In one embodiment of the present invention, the probe beam of FIGS. 12A-12B offers significant performance improvements to the EMPA capabilities. Borrowing the ideas presented for the optical column of FIG. 6, a 5 to 10 μm diameter sample area is illuminated by a series of circular beamlets with each beamlet lasting only for 1 to 10 ms. This results in the sample area being divided into several circular segments (e.g., such as circle 244 of FIG. 12A) and spectrum (backscattered and secondary electrons as well) from each circular segment recorded before the next segment is illuminated. In addition to the average of these spectra which is similar to the spectrum obtained from current methods, the additional information in the spectral difference between closely spaced, neighboring segments (auto correlation function) will be useful in improving the EMPA capabilities. If wide field projection optics of FIG. 6 is used instead of a probe beam, several $cm^2$ of sample area can be exposed without using expensive mechanical scanners.

In other applications of the invention, the probe beam can also enhance the operating temperature range of the LEEM/LEED tool to millikelvin temperatures from its present use limited to high temperatures. Due to the low temperature of operation (T<77 K), low power dissipation, low initial energy of the electrons (less than 0.1 eV) of the electron source (e.g., source 113 of FIG. 6), and compact lens design to focus/collimate low energy electrons, a new type of Cryo-LEEM/LEED tool can be designed. In one embodiment, the tool can operate from room temperature down to millikelvin temperatures for studying dynamic processes on surfaces as a function of temperature with nanometer resolution. In addition, Cryo-LEEM/LEED can also take advantage of superconducting bolometers (in the place of MCP detectors) for imaging the surface features and can operate at lower accelerating potentials (5 to 10 kV). Superconducting bolometer arrays are in common use in variety of applications including infrared, and T-ray detectors, ion and particle detectors. These ultra sensitive detectors are operated at relatively high response rates from few Hz to 10 kHz, allowing the study of dynamic processes on surfaces as a function of temperature.

It is specifically intended that the present invention not be limited to the embodiments and illustrations contained herein, but include modified forms of those embodiments including portions of the embodiments and combinations of elements of different embodiments as come within the scope of the following claims.

I claim:

1. A diode structure capable of emitting electrons, the diode structure comprising:
   a first layer;
   a second layer adjacent to the first layer, wherein the first and second layers form a diode junction; and
   a third layer adjacent to at least one of the first and second layers, wherein the third layer is electrically insulative and thermally conductive,
   wherein the third layer is at least indirectly in contact with a cooling device so that heat flows through the third layer away from the first and second layers, whereby the first and second layers are maintained within a temperature range that is substantially less than 100 degrees Kelvin.

2. The diode structure of claim 1, wherein the first and second layers are maintained within at a temperature that is substantially equal to 77 degrees Kelvin.

3. The diode structure of claim 1, wherein the third layer is a sapphire block layer, the cooling device is a thermal bath, and an additional base layer is positioned between the sapphire block layer and the thermal bath.

4. The diode structure of claim 1, wherein the third layer is adjacent to the second layer, the second layer is a silicon wafer, and the first layer is a porous layer.

5. The diode structure of claim 4, further comprising an additional layer adjacent to the first layer, wherein the additional layer is an electrode.

6. The diode structure of claim 5, wherein a voltage is applied between the electrode and at least one of the second layer and a fourth layer that is between the second and third layers and is in electrical communication with the second layer, and wherein application of the voltage causes the electrons to be emitted from at least one of the first layer and the electrode.

7. The diode structure of claim 6, wherein the voltage is pulsed over time, whereby a longevity of life of the diode structure is extended.

8. An electron source comprising the diode structure of claim 1, further comprising an electrode spaced apart from the diode structure, wherein the electrons emitted from the diode structure tend to proceed from the diode structure toward the electrode.

9. The electron source of claim 8, wherein the diode structure is placed in a partial vacuum of 5 torr or less of inert gas atmosphere.

10. The electron source of claim 8, wherein an accelerating voltage is experienced by the electrons proceeding from the diode structure toward the electrode, and wherein the accelerating voltage depends at least in part upon a voltage applied to the electrode.

11. An electron source comprising:
a diode structure having an emission surface; and
a voltage source that applies periodically-repeating time-varying voltage levels across the diode structure,
wherein the periodically-repeating time-varying voltage levels during each of a plurality of periods include a first negative voltage level that is followed by a first positive voltage level that is followed by a second negative voltage level,
wherein at least one of the following is also true:
(a) substantially all of the electrons emitted from the emission surface have energies of less than 0.1 eV;
(b) the emission surface is a large-area surface of at least several hundred square cm in area;
(c) the electron source emits electrons from the emission surface substantially only during the first positive voltage level of each period, the first positive voltage level is maintained for approximately 20 milliseconds, and the amount of electrons emitted from the emission surface when the diode structure experiences the first positive voltage level varies at least partly in dependence upon each of the first positive voltage level and an accelerating voltage experienced by the electrons due at least in part to an additional voltage applied to an electrode spaced apart from the emission surface; and
(d) the emission surface is divided into a plurality of surface protrusions, wherein each of the protrusions is separated from neighboring protrusions by at least one gap, and wherein at least one of the following is true:
(i) at least some of the protrusions are arc-shaped radial elements; and
(ii) at least some of the protrusions are rectangular-shaped elements.

12. The electron source of claim 11, wherein the electron source emits electrons from the emission surface substantially only during the first positive voltage level of each period.

13. The electron source of claim 12, wherein the first positive voltage level is maintained for approximately 20 milliseconds, and wherein the amount of electrons emitted from the emission surface when the diode structure experiences the first positive voltage level varies at least partly in dependence upon each of the first positive voltage level and an accelerating voltage experienced by the electrons due at least in part to an additional voltage applied to an electrode spaced apart from the emission surface.

14. The electron source of claim 11, wherein at least 95% of the electrons emitted from the emission surface have energies of less than 0.1 eV, the at least 95% of the electrons being substantially all of the electrons.

15. The electron source of claim 11, wherein the emission surface is a large-area surface of at least two thousand square cm in area.

16. The electron source of claim 11, wherein the emission surface is at least one of a planar surface and a curved surface.

17. The electron source of claim 11, wherein the emission surface is divided into a plurality of surface protrusions, wherein each of the protrusions is separated from neighboring protrusions by at least one gap.

18. The electron source of claim 17, wherein at least some of the surface protrusions are independently actuatable such that it is possible to cause electrons to be emitted from a first of the surface protrusions without causing electrons to be emitted from a second of the surface protrusions.

19. The electron source of claim 17, wherein at least one of the following is true:
at least some of the protrusions are arc-shaped radial elements; and
at least some of the protrusions are rectangular-shaped elements.

20. A system for generating and directing electron flow, the system comprising:
an electron source having a plurality of independently-actuatable emission surfaces each of which is capable of emitting electrons; and
an optical column adjacent to the electron source through which the emitted electrons pass, wherein the optical column includes a plurality of actuatable electrodes that are capable of influencing paths taken by the emitted electrons.

21. The system of claim 20, wherein the plurality of actuatable electrodes includes at least one wire mesh electrode having a first surface that is oriented in a manner that is substantially perpendicular to the paths taken by the emitted electrons, and at least one other electrode having a second surface that is oriented in a manner that is substantially parallel to the paths taken by the emitted electrons.

22. The system of claim 21, wherein the first surface is at least one of a planar surface, a spherical surface, and an otherwise curved surface, and wherein the second surface is at least one of a planar surface, a conical surface, and a cylindrical surface.

23. The system of claim 20, wherein the plurality of independently-actuatable emission surfaces are positioned at different respective positions along an interior of a curved surface, wherein the optical column includes a first region that is substantially conical and extends from the curved surface to a first level and a second region that is at least partly cylindrical and extends from the first level to a second level.

24. The system of claim 23, wherein at least a portion of a substantially conical surface extending around the first region is formed by a first conical electrode, and at least one additional spherical electrode extends inward through the first region away from the conical electrode.

25. The system of claim 24, wherein additional conical electrodes are supported within the first region, the additional conical electrodes being positioned in a manner that is substantially coaxial in relation to the first conical electrode.

26. The system of claim 23, wherein at least a portion of a substantially cylindrical surface extending around the second region is formed by a first cylindrical electrode, and a plurality of wire mesh electrodes extend inward though the second region away from the first cylindrical electrode, wherein each of the plurality of wire mesh electrodes is selected from the group consisting of a planar wire mesh electrode, a spherical wire mesh electrode, and a spheroidal wire mesh electrode.

27. The system of claim 26, wherein at least one of an additional wire mesh electrode, an additional cylindrical electrode, and an additional rod-shaped electrode is supported within the second region in a manner that is electrically isolated from the first cylindrical electrode.

28. The system of claim 23, wherein the second level is a level at which a wafer is positioned, and wherein an outer surface of the second region is formed by at least one of multiple cylindrical surfaces of different diameters and a combination of one cylindrical surface and one surface of revolution.

29. The system of claim 23, wherein a third level exists in between the first and second levels within the second region, wherein it is possible to position a mask at the third level.

30. The system of claim 29, wherein it is possible both to position the mask at the third level to allow for mask-based lithography and to remove the mask to allow for maskless lithography in relation to a wafer positioned at the second level.

31. The system of claim 20, wherein the plurality of independently-actuatable emission surfaces are positioned at different respective positions along a planar surface, and wherein the optical column includes a first region that is at least partly cylindrical and extends from the planar surface to a first level.

32. The system of claim 20, wherein the plurality of actuatable electrodes are capable of influencing at least one of a radial position of a path taken by the emitted electrons, a cross-sectional area of at least a portion of a beam formed by the emitted electrons, and a crossover location of at least the portion of the beam.

33. The system of claim 20, wherein independent actuation of the independently-actuatable emission surfaces causes the generation of respective beamlets of the electrons.

34. The system of claim 33, wherein each of the emission surfaces is an arc-shaped radial elements, and each of the respective beamlets also is arc-shaped at least proximate to its respective emission surface.

35. The system of claim 33, wherein actuation of several of the emission surfaces causes the formation of a ring-shaped combination beamlet.

36. The system of claim 33, wherein actuation of the independently-actuatable emission surfaces allows for the creation of overall wide beams of the emitted electrons so as to perform wide-field projection lithography.

37. The system of claim 20, wherein the plurality of actuatable electrodes are operated so as to direct a plurality of beamlets created by the actuation of the different independently-actuatable emission surfaces toward an aperture within which a crossover of the beamlets occurs.

38. The system of claim 37, further comprising an electrostatic lens and a magnetostatic lens that further focus a resulting electron stream subsequent to the crossover within the aperture so as to generate a single collimated beam.

39. A microscopy device employing the collimated beam generated by the system of claim 38 as a probe beam.

40. The microscopy device of claim 39, wherein the microscopy device is at least one of a scanning electron microscopy (SEM) device, an environmental SEM device, an electron microprobe analyser (EMPA), a low energy electron microscopy/diffraction (LEEM/LEED) device.

41. A device employing the single collimated beam of claim 38, wherein the device is at least one of a backward wave oscillator and a tool allowing for subnanometer alignment.

42. The system of claim 20, wherein the optical column includes at least one of a conical structure and a cylindrical structure having a plurality of electrically-conductive strips that follow respective substantially-linear paths along sides of the at least one structure, wherein each of the paths is within a respective plane passing through a central axis of the at least one structure, and wherein at least some of the electrically-conductive strips are electrically-isolated from neighboring ones of the electrically-conductive strips.

43. The system of claim 42, wherein the actuatable electrodes include the at least one structure and at least some of the electrically-conductive strips are independently-actuatable relative to others of the electrically-conductive strips.

44. The system of claim 43, wherein different voltages are applied to the different electrically-conductive strips so as to cause a rotation of a beamlet generated by at least one of the independently-actuatable emission surfaces as it passes through the at least one structure.

45. The system of claim 43, wherein the different voltages are applied to the different electrically-conductive strips so as to produce a variation in intensity along an arc length of a beamlet passing through the at least one structure.

46. The system of claim 43, wherein due to the variation in intensity in the beamlet, at least one pixel beamlet is produced, and wherein generation of the at least one pixel beamlet in combination with other pixel beamlets allows for a maskless lithography procedure to be performed in relation to a wafer positioned at a second end of the optical column opposite a first end of the optical column at which is positioned the electron source.

47. The system of claim 43, wherein the different electrically-conductive strips are coupled to adder circuits, wherein at least a portion of at least one of the adder circuits is surface-mounted on at least one of the strips, wherein each of the adder circuits includes a respective plurality of optical switching devices, and wherein at least some of the signals provided to some of the adder circuits are multiplexed, whereby the voltages applied to the strips can be rapidly changed.

48. The system of claim 20, wherein the optical column includes a mask level at which a mask is positioned within the optical column, and wherein the mask is at least one of a single mask and a combination mask formed by assembling a plurality of sub-masks to one another.

49. A complementary set of masks that are successively positioned at a mask level within the optical column of the system of claim 20, wherein a first of the masks includes a plurality first orifices, wherein a second of the masks includes a plurality of second orifices, wherein a first total area of the first orifices is at least ten times larger than a second total area of the second orifices, wherein exposure of a wafer by way of both of the first and second masks results in the wafer being exposed to electrons corresponding to a combination of the first and second orifices, and wherein substantially less dosage is required to illuminate the second orifices of the second mask than is required to illuminate the first orifices of the first mask.

50. A method manufacturing a chip-based device through the use of the system of claim 20, the method comprising:
   providing a library of masks concerning standardized features to be created on chip-based devices;
   selecting at least one of the masks of the library;
   installing the mask into the system;
   performing mask-based lithography upon a wafer using the system incorporating the mask so that the standardized features are created on the wafer;
   removing the mask from the system; and
   performing maskless lithography upon the wafer so that special additional features are further created on the wafer,
   wherein the wafer need not be physically moved during the performing of the mask-based lithography and the maskless lithography.

51. The method of claim 20, wherein the chip-based device is at least one of a microchip, a microcomputer, a microprocessor, a computer, a controller, an integrated circuit, an application-specific integrated circuit (ASIC), and a programmable logic device.

52. A wafer manufacturing apparatus employing a plurality of the systems of claim 20, the wafer manufacturing apparatus further comprising:
   a control device;
   a memory device coupled to the control device;
   a first communication network linking the control device with each of the different ones of the systems, wherein the first communication network communicates at least one of grey level control data and lens strip control data to each of the systems; and
   a second set of communication links respectively coupled to different ones of the systems, wherein the respective communication links of the second set respectively communicate respective error control data to the respective systems.

53. The wafer manufacturing apparatus of claim 52, wherein the systems are grouped into a plurality of sets of the systems, and wherein mask alignment data is additionally communicated to the respective sets of the systems by way of a third set of communication links.

54. The system of claim 20, wherein at least one of a mask alignment, a wafer alignment, and a calibration process are accomplished using a pixellized MCP array positioned proximate a level of the mask.

55. A mask capable of being used to manufacture the diode structure of an electron source, the electron source comprising a diode structure having an emission surface and a voltage source that applies periodically-repeating time-varying voltage levels across the diode structure, wherein the periodically-repeating time-varying voltage levels during each of a plurality of periods include a first negative voltage level that is followed by a first positive voltage level that is followed by a second negative voltage level, the mask comprising:
   a plurality of arc-shaped orifices separated from one another by portions of the mask.

56. A method of manufacturing the electron source by way of the mask of claim 55, the method comprising:
   providing the mask;
   overlaying the mask on a layer of a diode structure;
   depositing metallic material onto the combination of the mask and the diode structure; and
   removing the mask so as to reveal the diode structure with a plurality of arc-shaped surface protrusions.

57. An electron source comprising:
   a diode structure having an emission surface, the diode structure being at least partly formed from porous silicon; and
   a voltage source that applies periodically-repeating time-varying voltage levels across the diode structure,
   wherein the periodically-repeating time-varying voltage levels during each of a plurality of periods include a first negative voltage level that is followed by a first positive voltage level that is followed by a second negative voltage level, and wherein at least one of the following is also true:
   (a) substantially all of the electrons emitted from the emission surface have energies of less than 0.1 eV;
   (b) the emission surface is a large-area surface of at least several hundred square cm in area; and
   (c) the electron source emits electrons from the emission surface substantially only during the first positive voltage level of each period, the first positive voltage level is maintained for approximately 20 milliseconds, and the amount of electrons emitted from the emission surface when the diode structure experiences the first positive voltage level varies at least partly in dependence upon each of the first positive voltage level and an accelerating voltage experienced by the electrons due at least in part to an additional voltage applied to an electrode spaced apart from the emission surface.

58. The electron source of claim 57 wherein the electron source emits electrons from the emission surface substantially only during the first positive voltage level of each period.

59. An electron source comprising:
   a diode structure having an emission surface, the diode structure being at least partly formed from porous silicon; and
   a voltage source that applies periodically-repeating time-varying voltage levels across the diode structure,
   wherein the periodically-repeating time-varying voltage levels during each of a plurality of periods include a first negative voltage level that is followed by a first positive voltage level that is followed by a second negative voltage level, and wherein at least one of the following is true:
   (a) at least 95% of the electrons emitted from the emission surface have energies of less than 0.1 eV; and
   (b) the emission surface is a large-area surface of at least two thousand square cm in area.

60. The electron source of claim 57 wherein at least one of the following is true:
   (a) the emission surface is at least one of a planar surface and a curved surface, and;
   (b) the emission surface is divided into a plurality of surface protrusions, wherein each of the protrusions is separated from neighboring protrusions by at least one gap.

61. The electron source of claim 59, wherein the electron source emits electrons from the emission surface substantially only during the first positive voltage level of each period.

62. The electron source of claim 59, wherein at least one of the following is true:
   (a) the emission surface is at least one of a planar surface and a curved surface, and;
   (b) the emission surface is divided into a plurality of surface protrusions, wherein each of the protrusions is separated from neighboring protrusions by at least one gap.

* * * * *